(12) United States Patent
Sung et al.

(10) Patent No.: US 9,746,701 B2
(45) Date of Patent: Aug. 29, 2017

(54) DISPLAY DEVICE

(71) Applicant: LG ELECTRONICS INC., Seoul (KR)

(72) Inventors: Jaehyun Sung, Seoul (KR); Jinsu Kim, Seoul (KR); Ahreum Lee, Seoul (KR); Hyeoncheol Song, Seoul (KR); Sangdon Park, Seoul (KR); Moungyoub Lee, Seoul (KR); Heewon Kwon, Seoul (KR); Deogjin Lee, Seoul (KR); Inkeun Ryu, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 238 days.

(21) Appl. No.: 14/063,068

(22) Filed: Oct. 25, 2013

(65) Prior Publication Data

US 2014/0118910 A1    May 1, 2014

(30) Foreign Application Priority Data

Oct. 25, 2012 (KR) .................. 10-2012-0119096
Oct. 26, 2012 (KR) .................. 10-2012-0119976

(51) Int. Cl.
*G02F 1/1333* (2006.01)
*G09F 9/30* (2006.01)
*H05K 7/14* (2006.01)

(52) U.S. Cl.
CPC ........ *G02F 1/133305* (2013.01); *G09F 9/301* (2013.01); *H05K 7/14* (2013.01); *G02F 2001/133314* (2013.01)

(58) Field of Classification Search
CPC ......... G02F 1/133305; G02F 1/133322; G02F 1/133354; H05K 7/14; G09F 9/30
See application file for complete search history.

(56) References Cited

U.S. PATENT DOCUMENTS

| | | | |
|---|---|---|---|
| 9,116,662 B1* | 8/2015 | Song | G06F 1/1601 |
| 2008/0303782 A1 | 12/2008 | Grant et al. | |
| 2010/0188422 A1 | 7/2010 | Shingai et al. | |
| 2012/0281367 A1 | 11/2012 | He et al. | |
| 2014/0004906 A1* | 1/2014 | Chi | H04B 1/38 455/566 |

(Continued)

FOREIGN PATENT DOCUMENTS

| | | |
|---|---|---|
| CN | 101840656 | 9/2010 |
| JP | 10-026754 | 1/1998 |

(Continued)

OTHER PUBLICATIONS

International Search Report issued in related Application No. PCT/KR2013/009503 dated Mar. 7, 2014.

(Continued)

*Primary Examiner* — Dung Nguyen
(74) *Attorney, Agent, or Firm* — Ked & Associates, LLP

(57) ABSTRACT

A display device is provided. The display device may include a display panel for displaying an image and a back cover provided behind the display panel and coupled to the display panel. A bending assembly may be coupled to the back cover to bend the display panel. A controller may be provided that is configured to control the bending assembly to apply a physical force to the back cover to bend the display panel a prescribed amount.

21 Claims, 27 Drawing Sheets

(56) References Cited

U.S. PATENT DOCUMENTS

2015/0009635 A1\* 1/2015 Kang ...................... G09F 9/301
  361/749

FOREIGN PATENT DOCUMENTS

| JP | 2006-023676 | 1/2006 |
| JP | 2009-063640 | 3/2009 |
| JP | 2009-109812 | 5/2009 |
| WO | WO 2010/085575 | 7/2010 |
| WO | WO 2012/006799 | 1/2012 |

OTHER PUBLICATIONS

European Search Report dated Oct. 8, 2015 issued in Application No. 13848601.4.
Chinese Office Action dated Aug. 2, 2016 issued in Application No. 201380055774.8.
European Office Action dated Feb. 15, 2017 issued in Application No. 13848601.4.

\* cited by examiner (a)

(b)

(c)

DISPLAY DEVICE

CROSS-REFERENCE TO RELATED APPLICATION(S)

This application claims priority under 35 U.S.C. §119 to Korean Application Nos. 10-2012-0119096 filed in Korea on Oct. 25, 2012 and 10-2012-0119976 filed in Korea on Oct. 26, 2012, whose entire disclosures are hereby incorporated by reference.

BACKGROUND

1. Field

Provided is a display device and a bending assembly configured to bend the display device.

2. Background

The present disclosure relates to a display device and method of changing a curvature of the display screen to improve user's immersion while viewing the display screen.

A display device may be a Liquid Crystal Display Device (LCD), a Plasma Display Panel (PDP), an Electro Luminescent Display (ELD), and a Vacuum Fluorescent Display (VFD). Display devices may also include 3-D imaging technology. With proliferation and advancement in digital technology, improvements in display technology to provide content to users is needed.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein:

FIG. 21A is bent;

FIG. 24A is bent;

DETAILED DESCRIPTION

Figure 1:
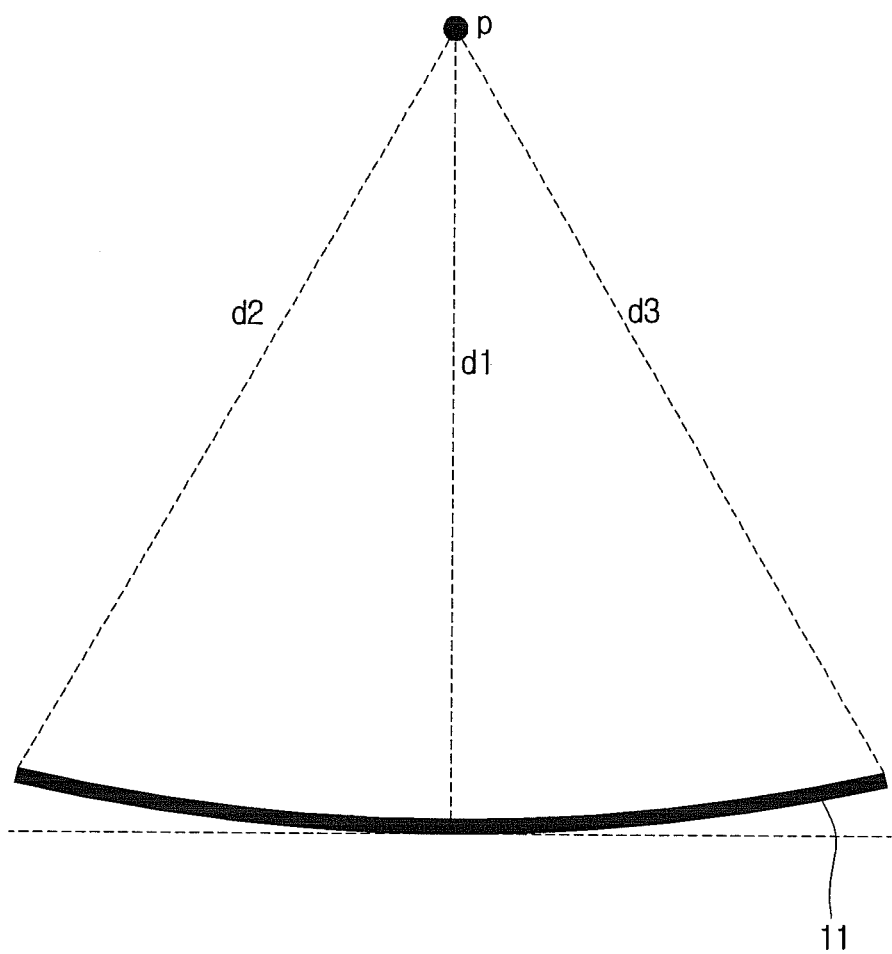
FIG. 1 is a view illustrating a shape of a display module according to an embodiment of the present disclosure.

Hereinafter a display device according to embodiments of the present disclosure will be described in more detail with reference to the drawings. Hereinafter, each of embodiments described herein may be modified in various forms, and the technical range of the present disclosure is not limited thereto. Moreover, the form and size of each of components shown in the drawings may be exaggerated for clarity of illustration.

FIG. 1 is a view illustrating a bending shape of a display module according to the present disclosure. The display module 11 (also display panel) equipped in a display device may bend in a curved shape with a constant curvature R.

For example, in relation to the curved shape of the display module 11, the curvature R may be set to allow the distances d1, d2, and d3 between a user's viewing position P and the front side of a panel to have the same or similar value, and the display module 11 may have a shape that is bent depending on the set curvature R.

Accordingly, while viewing an image displayed on a display device, user's immersion in the displayed content may be improved, and especially, when viewing a 3D image, user's immersion may be drastically improved by the curved shape of the display module 11. Moreover, the display module 11 displaying an image may include a self light emitting panel such as an OLED panel, or may include a panel that is not a self light emitting panel such as an LCD panel or a PDP panel and a backlight unit emitting light to the panel.

Hereinafter, merely for ease in description, the display module 11 is depicted as a self light emitting Organic Light Emitting Device (OLED) panel that uses an OLED as an example. The OLED has a structure in which an organic light emitting layer of a functional thin film form is inserted between an anode electrode and a cathode electrode. Holes are injected from the cathode electrode and electrons are injected from the anode electrode so that the electrons and holes are combined to form excitons in the organic light emitting layer and then, the excitons are recombined to emit light As a method of realizing a full color organic light emitting display, there are an independent light emitting method, a color filter method, and a color conversion method. The independent light emitting method realizes R, G, and B by thermally depositing a light emitting material of each of R, G, and B with a metal shadow mask having a detailed pattern. The color filter method realizes R, G, and B by forming a white light emitting layer and patterning an R, G, and B color filter. The color conversion method forms a blue light emitting layer and realizing R, G, and B by using a color conversion layer changing blue into green and red. However, it should be appreciated that a display module of the present disclosure is not limited to an OLED panel, and as mentioned above, various flat panel display modules such as an LCD module, a PDP module, an FED module, or another appropriate type of display may be applied to the present disclosure.

The display module 11 may be a flat panel display module 11 having a curvature close to 0°, and the flat panel display module 11 may be bent by a back cover 12. Thus, the display module 11 may have a curved shape having the constant curvature R as shown in FIG. 1.

Figure 2:
FIG. 2 is a view illustrating a shape of a display module and a back cover according to an embodiment of the present disclosure.
Figure 2:
Figure 2:
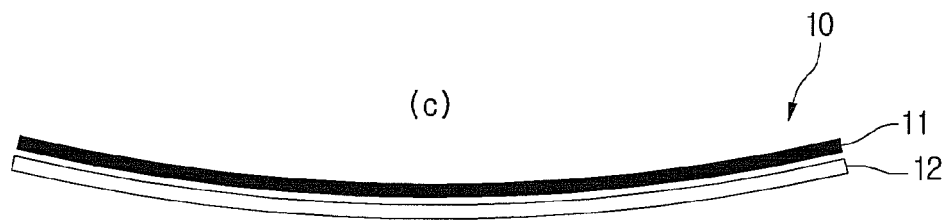

FIG. 2 is a sectional view illustrating a configuration of a display device according to the present disclosure. As shown in FIG. 2(a), the display module 11 may be the flat panel display module 11. As shown in FIG. 2(b), the back cover 12 disposed at the rear of the display module 11 may be bent by applying a force to the display module 11. Therefore, as shown in FIG. 2(c), the display module 11 and the back cover 12 may be bent together. While FIG. 2 illustrates only the display module 11 and the back cover 12 among components of the display device according to an embodiment of the present disclosure, the display device may further include various components not illustrated.

Here, the back cover 12 may be a single plate-shaped member coupled to the rear of the display module 11 and may be formed of a material having elasticity to be bent forward. For example, the back cover 12 may be formed of Carbon Fiber-reinforced Plastic (CFRP). The back cover 12 may be disposed at the rear of the display module 11 and may serve to protect the display module 11. The back cover 12 may also be used to bend the display module 11 by applying physical force to the display module 11. However, the back cover 12 is not necessarily formed of a single plate-shaped member, and thus, may be formed of a plurality of plate-shaped members or an assembly in which another configuration is coupled to a plurality of plate-shaped members.

Additionally, in the present disclosure, although the back cover 12 having the approximately same area as the display module 11 is shown in the drawing, this illustrates just a conceptual shape to describe the bending shape of the back cover 12 and the display module 11. The actual back cover 12 may have a vertical or horizontal width that is shorter or longer than that of the display module 11. That is, the shape and size of the back cover 12 is not limited to the drawing.

Moreover, the center of the back cover 12 in the lateral direction and the display module 11 may be fixed, and other parts other than the center may be installed not to restrain movement forward or backward. Therefore, when the back cover 12 and the display module 11 are bent, the left and right edges may move front to back.

However, the back cover 12 and the display module 11 may be installed so that the front to back movements of both lateral ends are restrained and the center of the display in the lateral direction may move front to back. In this case, the back cover 12 and the display module 11 may be bent.

Moreover, a display device according to an embodiment of the present disclosure may include a bending assembly that bends a display unit 10 by applying physical force to the display unit 10. The bending assembly may include a bending actuator and a bending control unit that controls the bending actuator. Here, the display unit 10 may include the above-mentioned display module 11 and back cover 12. Moreover, the display unit 10 may further include a middle cover 13 between the display module 11 and the back cover 12.

In addition, the bending actuator as used herein may also refer to a device that produces mechanical force through use of various types of energy sources such as electricity or hydraulic pressure. The bending actuator may be provided in various shapes as described with various embodiments below.

The bending control unit may control operations of the bending actuator. For example, when the bending actuator is an elastic member, for example being formed of a shape memory alloy, the bending control unit adjusts the amount of current applied to the shape memory alloy to adjust a temperature change of the shape memory alloy, so that a length change of the shape memory alloy may be controlled. Moreover, when the bending actuator is a sensitive heat tube surrounded by conductive wire, electromagnet, bimetal, piezoelectric element, or heat wire, operations of the bending actuator may be controlled. This will be described later in each embodiment.

Hereinafter, with reference to FIGS. 3A to 37, specific embodiments of a display device including the combined above-mentioned configurations according to the present disclosure will be described in more detail.

Hereinafter, a configuration of a display device according to one embodiment of the present disclosure will be described with reference to FIGS. 3A to 10. FIGS. 3A to 10 schematically illustrate only a configuration relating to the bending of the display module 11 merely for ease of description of a structure and principle for bending a display device. However, it should be appreciated that the display device may include various other configurations besides the shown configuration.

Figure 3A:
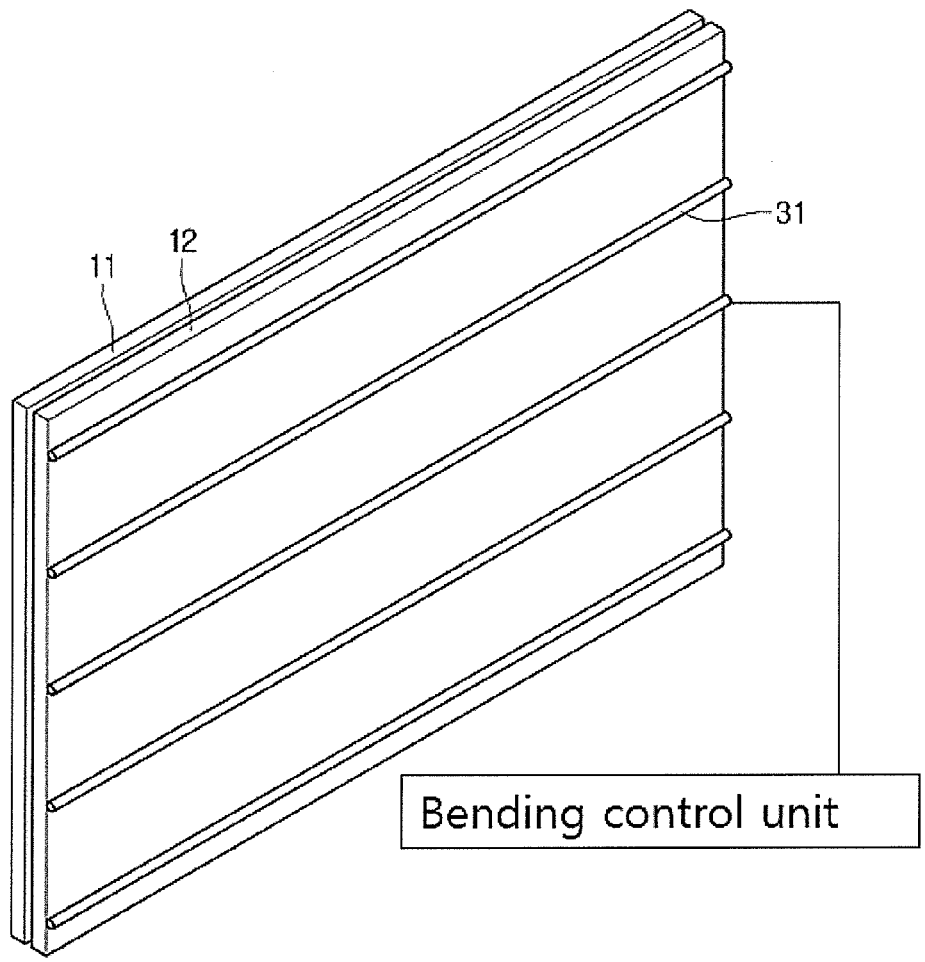
FIGS. 3A and 3B are views illustrating a portion of a display device according to an embodiment of the present disclosure.
Figure 3B:
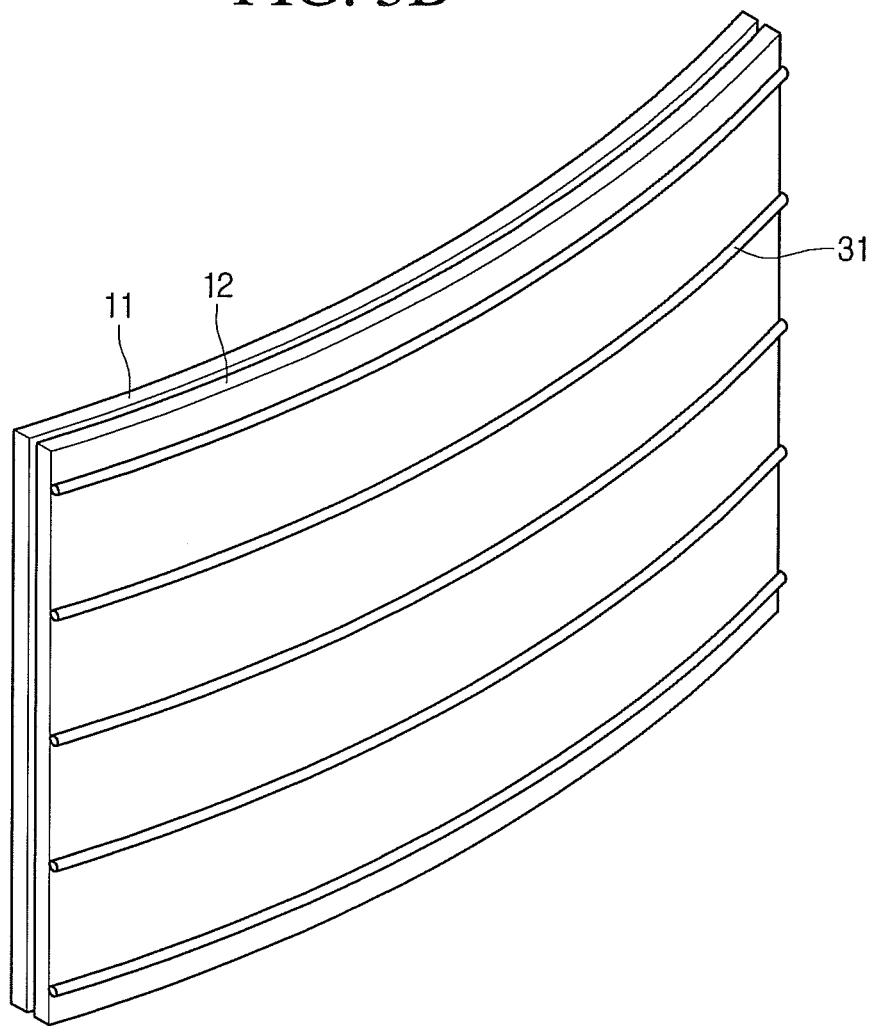
Figure 4:
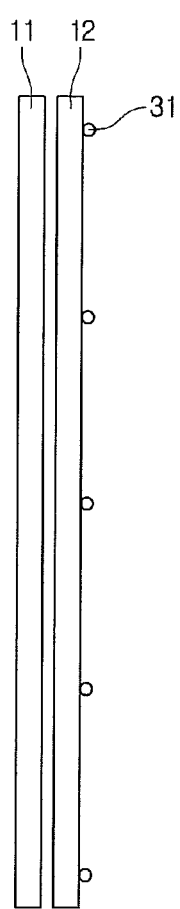
FIGS. 4 to 6 are cross-sectional views illustrating a portion of a display device according to an embodiment of the present disclosure.

First, referring to FIGS. 3A, 3B, and 4, the display device may include the display module 11, the back cover 12 coupled to the rear of the display module 11, and the bending assembly bending the back cover 12. Here, the bending assembly includes a elastic members. The elastic member may be formed of, for example, a shape memory alloy (SMA).

SMA is an alloy using shape memory and superplastic properties appearing in a metal transformed from austenite to martensite. When a specific shape is memorized in austenite of a high temperature state and then cooled to low temperature, martensite transformation occurs, and residual stress is formed in the tissue. Therefore, the specific shape is transformed. Then, when being heated again at an austenite temperature, the transformed specific shape is restored to its original shape.

Accordingly, when current flows in an SMA set to be restored to an original shape at a predetermined temperature, the SMA serves as resistance and temperature increases. Therefore, the SMA returns to its original shape and size according to temperature increase. At this point, the SMA may be set to increase or decrease its length at an increased predetermined temperature.

Moreover, the bending assembly may include a bending actuator that applies physical force to the back cover 12 and a bending controller (also bending control unit) that controls operations of the bending actuator. Here, the bending actuator may include an SMA 31 and the bending control unit may control a length change of the SMA 31.

The SMA 31 may be provided in a rod shape extending in the left and right directions, and may be attached to the backside of the back cover 12. For reference, the front side of the back cover 12 is a side facing the display module 11 and its backside is the opposite side. The rod shape may have various cross-sections, such as a round or rectangular cross-section. For example, the SMA 31 may have a cylindrical or wire shape.

The SMA 31 may be provided in plurality, horizontally in parallel to each other. The SMA 31 may be provided to maintain a predetermined length at a room temperature and when the temperature rises more than a set temperature, its length extends.

At this point, the rise in the temperature may be achieved by power supply that is controlled by the bending control unit. Accordingly, once power is supplied by the bending control unit, a resistance of the SMA 31 causes the temperature to rise. As the temperature rises, the length of the SMA 31 extends laterally, in the left and right directions.

When the length of the SMA 31 increases, the back cover 12 may bend and both the left and right ends of the display module 11 may protrude toward the front relative to the center of the display module 11, and its center may have a concave shape. At this point, an angle at which the back cover 12 bends may be adjusted by controlling an amount of current through the SMA 31.

When the back cover 12 is bent, the both left and right ends of the back cover 12 applies pressures to the left and right edge of the backside of the display module 11, and the display module 11 is concavely bent toward the front. Therefore, user's immersion in the viewed image or perception may be enhanced.

Figure 5:
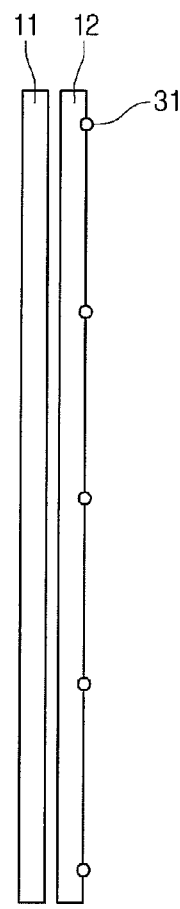

Moreover, as shown in FIG. 5, a recess may be formed to receive the SMA 31. For example, a groove-shaped receiving unit for receiving the SMA 31 may be formed concave from the backside toward the front at the rear of the back cover 12 and the SMA 31 may be received therein.

Figure 6:
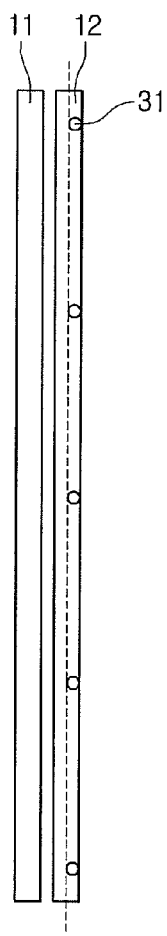

Additionally, as shown in FIG. 6, the SMA 31 may be buried in or encapsulated in the back cover 12. The depth of the SMA 31 in the back cover 12 may be provided such that it is positioned toward the rear side of the back cover 12 relative to a center depth of the back cover 12, as illustrated. In this case, the SMA receiving unit may be a space where the SMA 31 in the back cover 12 is disposed. The SMA may be insert-molded together with the back cover 31.

Figure 7:
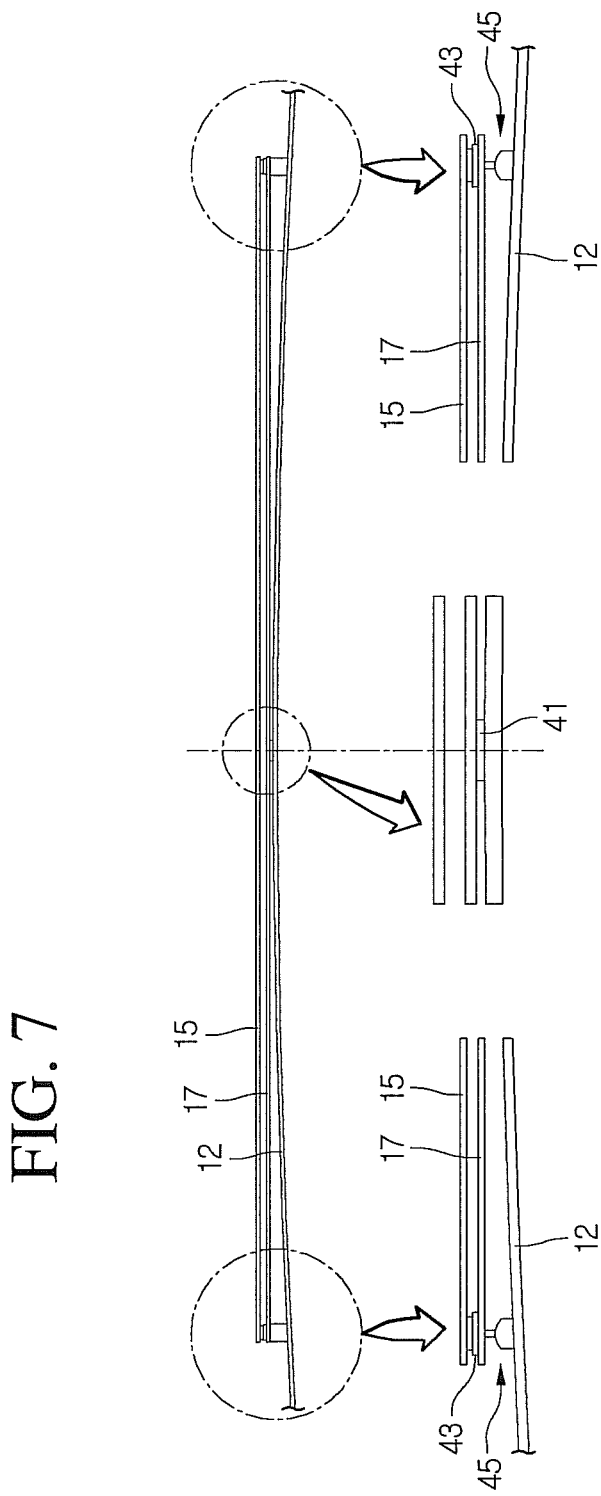
FIG. 7 is a plan view illustrating a coupling structure of a back cover and a printed circuit board.

A printed circuit board (PCB) may be coupled to the rear of the display module 11 and the back cover 12 having the above configuration. Referring to FIG. 7, the back cover 12 may be coupled to the PCB 15 by using a bracket 17.

The plate-shaped bracket 17 may be disposed at the rear of the back cover 12 and the PCB 15 may be disposed at the rear of the bracket 17. At this point, the back cover 12 and the bracket 17 may be coupled by a first fastener 41 at the central part and the bracket 17 and the PCB 15 may be coupled by a second fastener 43 at the left and right direction edges.

Accordingly, the first fastener 41 may be coupled to the backside of the back cover 12 at the center in the lateral direction and the front side of the bracket 17 at the center in the lateral direction, and the second fastener 43 may be coupled to the backside of the bracket 17 near the left and right side edge and the front of the PCB 15 near the left and right side edge.

Figure 8A:
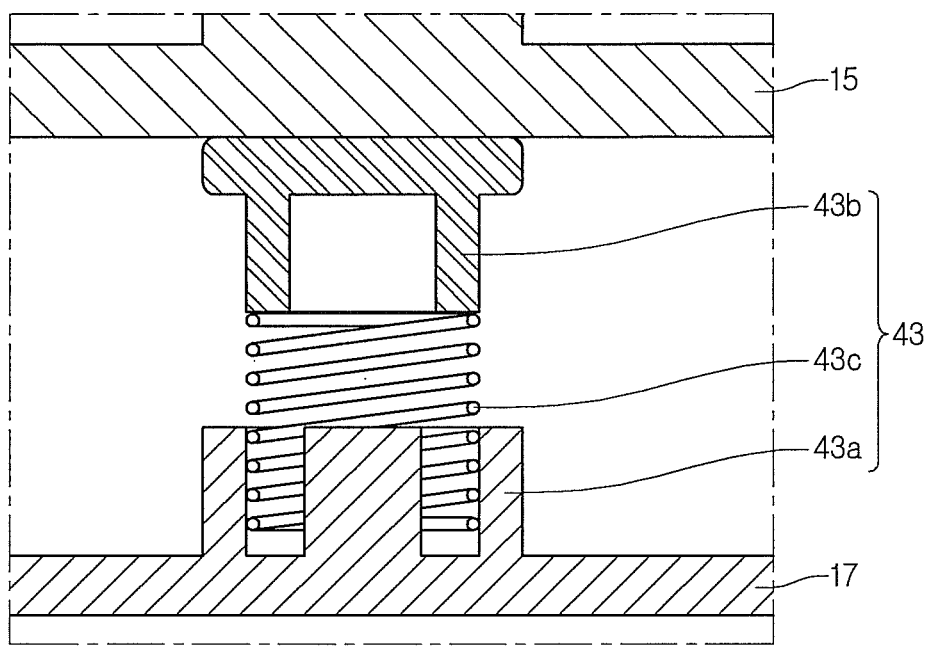
FIGS. 8A and 8B are sectional views of a second fastener.
Figure 8B:
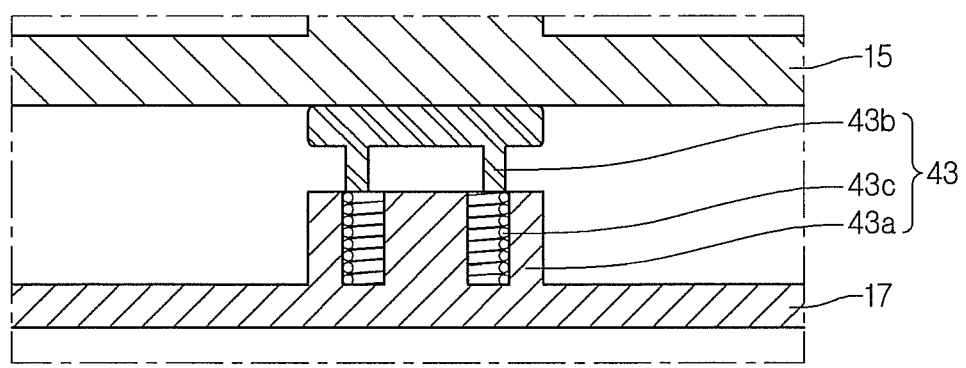

FIGS. 8A to 8B are sectional views illustrating a structure of the second fastener 43. The fastener 43 may include a front support part 43a of a roughly cylindrical shape coupled to the rear of the bracket 17, a spring 43c having the rear end supported by the front support part 43a, and a head part 43b coupled to the rear end of the spring 43c.

The front support unit 43a may be a pem nut whose portion protrudes toward the rear and the head part 43b may be a member of a roughly cylindrical shape. The head part 43b may be coupled to the PCB 15. Here, the spring 43c may be a coil spring. The second fastener 43 maintains a state as show in FIG. 8A usually but when external force is applied to the bracket 17 or the PCB 15, as shown in FIG. 8B, the spring 43c is compressed so that impact between two members is absorbed.

Figure 9:
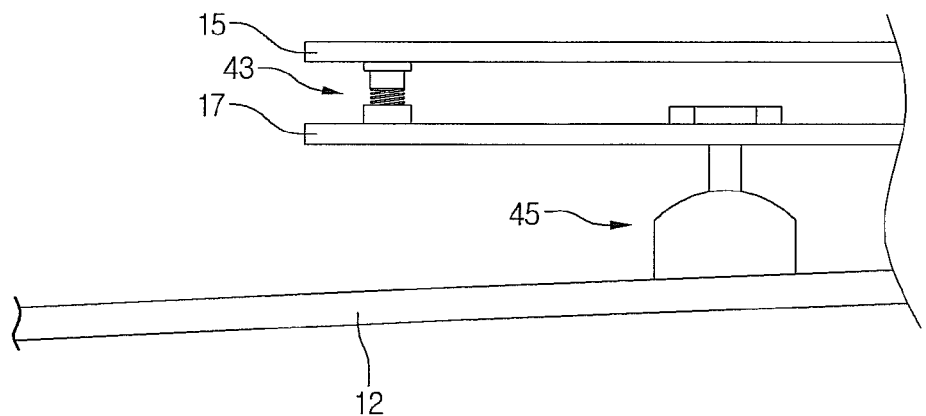
FIG. 9 is a sectional view of a third fastener.
Figure 10:
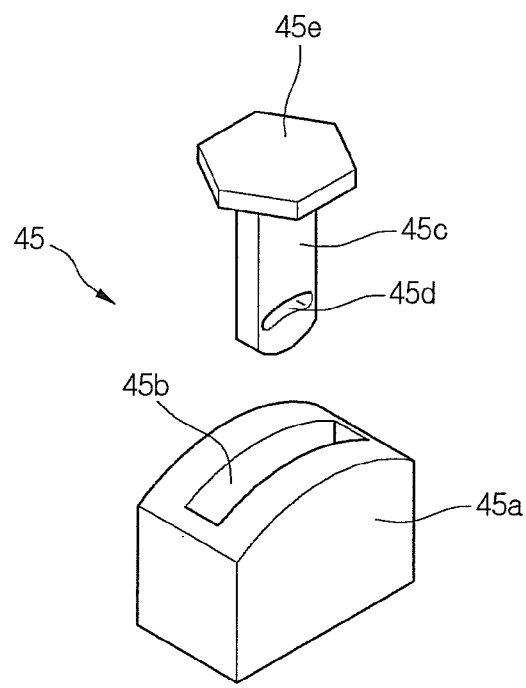
FIG. 10 is a separate perspective view of a third fastener.

Moreover, the left and right edges of the back cover 12 and the left and right edges of the bracket 17 may be coupled to each other by a third fastener 45. FIGS. 9 and 10 illustrate the third fastener 45 in more detail.

The third fastener 45 provides a fastening structure that absorbs the bending of the back cover 12 between the back cover 12 and the bracket 17. The third fastener 45 may include a first member 45a coupled to the backside of the back cover 12 and a second member 45c coupled to the front side of the bracket 17. The backside of the first member 45a may have a rounded shape whose center protrudes convexly, and an opening part 45b extending in the lateral direction may be formed at the center of the rear.

The second member 45c may extend from front to back relative to the display module 11 and may be insertable into the opening part 45b. A long hole 45d may be formed long in the lateral direction in the second member 45c. The long hole 45d may have a rounded shape as may progressively approach the left and right edge. Moreover, a head 45e may be coupled to the rear of the second member 45c.

Accordingly, when the second member 45c is inserted into the opening part 45b of the first member 45a, a coupling protrusion may be inserted into the long hole 45d. Therefore, the second member 45c may be rotatable based on the coupling protrusion and may be movable by the length of the long hole 45d. Accordingly, the back cover 12 in a flat state or a bending state may be continuously coupled to the back cover 12 and the bracket 17.

Figure 11A:
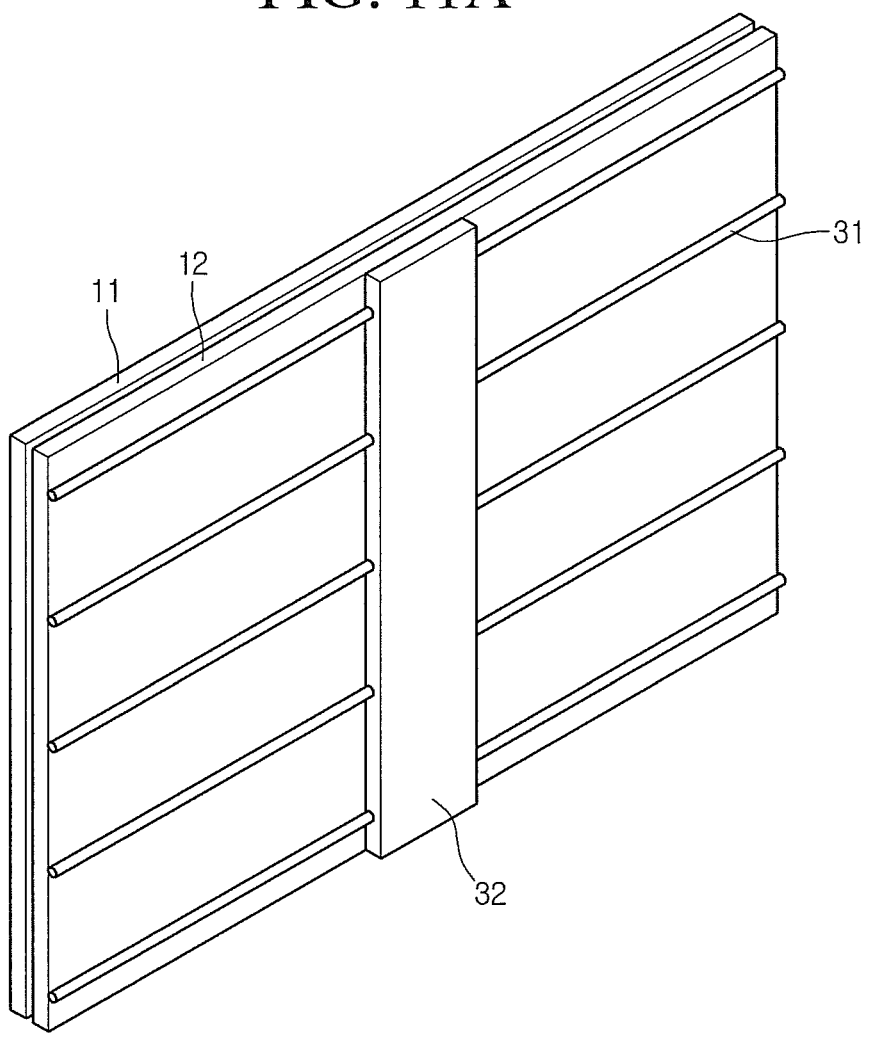
FIGS. 11A and 11B are views illustrating a partial configuration of a display device according to another embodiment of the present disclosure.
Figure 11B:
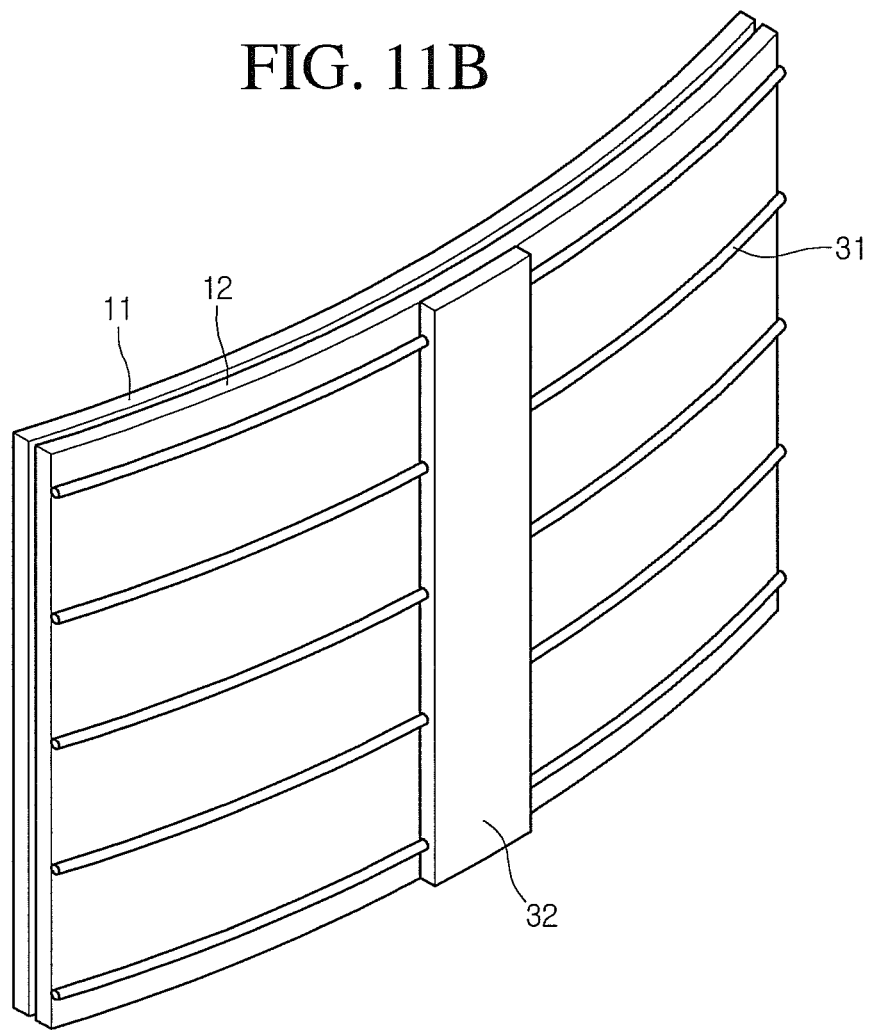

Hereinafter, a configuration of a display device according to one embodiment of the present disclosure will be described with reference to FIGS. 11A and 11B. FIGS. 11A and 11B schematically illustrate only a configuration relating to the bending of the display module 11 merely for ease of description of a structure and principle for bending a display device. However, it should be appreciated that the display device may include various other configurations besides the shown configuration.

The display device includes a display unit bending toward the front and a bending assembly bending the display unit. The display unit includes a display module 11 and a back cover 12 coupled to the rear of the display module 11. The bending assembly bends the back cover 12 so as to bend a display panel.

Moreover, the bending assembly includes a bending actuator applying physical force to the back cover 12 and a bending control unit controlling operations of the bending actuator.

In the embodiment of FIG. 3, the SMA 31 configuring the bending actuator extends from the left end part of the back cover 12 to the right end part. However, in this embodiment, a fixing unit 32 (also support bracket) is provided at the rear center of the back cover 12. Accordingly, the bending actuator according to this embodiment includes the SMA 31 and the fixing unit 32 where the SMA 31 is fixed. The bending control unit controls operations of the bending actuator.

The SMA 31 has a rod shape (e.g., cylindrical or wire shape) and extends in the left and right directions. A plurality of SMAs 31 may be attached to the rear of the back cover 12 and extend horizontally, parallel to each other. There may be a group of SMAs 31 that form a left column at the left side of the fixing unit 32 and there may be a group of SMAs 31 that form a right column at the right side of the fixing unit 32. Accordingly, the right end part of the left column and the left end part of the right column may be fixed at the fixing unit 32.

Due to the above configuration, when power is applied to the SMA 31, the wires extend in the left and right directions and the back cover 12 is bent toward the front with a centrally concaved shape. At this point, the control unit may supply power to the left column to allow only a portion where the left column is attached to be bent and on the contrary, may supply power to the right column to allow only a portion where the right column is attached to be bent. Moreover, by differently supplying the amount of current applied to the left column or the right column, the degree of bending may differ.

When the back cover 12 is bent, the both left and right end parts of the back cover 12 forwardly applies pressures around the left and right edges of the display module 11, so that the display module 11 is bent simultaneously. Moreover, when power is cut off by the bending control unit, and thus a temperature of the SMA 31 drops, the length of the SMA 31 is reduced and the display module 11 and the back cover 12 return to their original flat states by the elastic restoring force of the material.

While the SMA 31 is described herein as including only the two columns such as the left column and the right column, the SMA 31 may have other configurations, for example, to have three columns or more.

Furthermore, as shown in FIGS. 11A and 11B, the SMA 31 may be attached to the backside of the back cover 12, or like FIGS. 5 and 6, the SMA 31 may be received in the SMA receiving unit on the inner side of the back cover 12. Like the embodiment of FIG. 5, the SMA receiving unit may have a groove shape concave toward the inner side (the front) at the backside of the back cover 12, and when the SMA 31 is buried inside the back cover 12, the space in which it is buried may be the SMA receiving unit.

Moreover, when the SMA 31 is buried inside the back cover 12, it may be disposed toward the rear of the back cover 12 with respect a depth of the back cover 12. The reason is that the length of the SMA 31 increases at a predetermined temperature in this embodiment. Additionally, when the SMA 31 is received in the SMA receiving unit, a portion of the fixing unit 32 may be buried at the rear of the back cover 12.

Moreover, in the display device according to the present disclosure, the bracket 17, the first fastener 41, and the second fastener 43 shown in FIGS. 7 to 8B may be applicable for the coupling of the PCB 15. Additionally, as shown in FIGS. 9 and 10, the third fastener 45 may be applicable.

Figure 12:
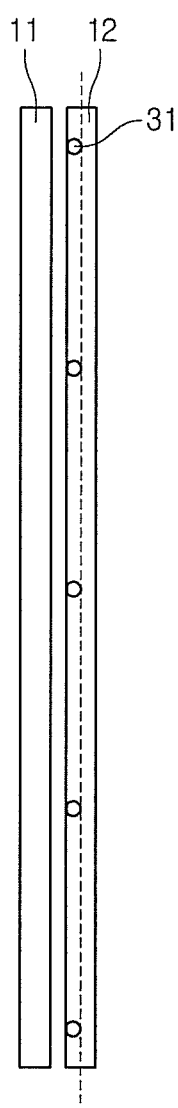
FIG. 12 is a cross-sectional view illustrating a partial configuration of a display device according to another embodiment of the present disclosure.

Hereinafter, a configuration of a display device will be described with reference to FIG. 12. FIG. 12 schematically illustrates only a configuration relating to the bending of the display module 11 merely to facilitate description of a structure and principle for bending a display device. However, the display may include various other configurations besides the shown configuration.

The SMA 31 may be disposed at position symmetric to the position of FIG. 6 toward the front of the back cover 12 toward the display, as illustrated in FIG. 12. The display device may include a display unit for displaying an image and a bending assembly for bending the display unit. The display unit may include a display module 11 displaying an image and a back cover 12 coupled to the rear of the display module 11.

Moreover, the bending assembly may include a bending actuator applying physical force to the back cover 12 and a bending control unit controlling operations of the bending actuator. Here, the bending actuator may include the SMA 31 and the bending control unit that controls a length change of the SMA 31.

The SMA 31 may be provided in a rod shape (e.g., cylindrical or wire shape) and extending in the left and right directions, and may be attached to the front of the back cover 12. The SMA 31 maintains a predetermined length at a room temperature and when the temperature rises more than a set temperature, its length is reduced. Here, because the SA 31 is provided toward the front surface of the back cover 12, the length of the SMA 31 is reduced to bend the display forward. At this point, the rise in the temperature may be achieved by power supply that is controlled by the bending control unit.

Accordingly, once power is supplied by the bending control unit, current flows though the SMA and the resistance of the SMA 31 generates heat, thereby raising its temperature. As the temperature rises, the length of the SMA 31 is reduced laterally, i.e., in the left and right directions.

When the length of the SMA 31 is reduced, the back cover 12 becomes bent and both the left and right ends may protrude toward the front relative to its center, and the center may have a concave shape. At this point, an angle at which the back cover 12 bends may be adjusted by controlling the amount of current to the SMA 31. When the back cover 12 is bent, the display module 11 at the front of the back cover 12 is concavely bent toward the front. Due to this, user's immersion or perception while viewing the display may be enhanced.

Moreover, when the SMA 31 is disposed at the front of the back cover 12, like the above embodiment (refer to FIGS. 11A and 11B), the SMA 31 may be grouped to form a left column and the right column, or other configurations, for example, three columns or more. Furthermore, the length of each column may be differently controlled. For example, the length of the SMA 31 in the left column may be controlled to have a first prescribed length, and the SMA 31 in the right column may be controlled to have a second prescribed length, such that the curvature of the display may be controlled more precisely.

Moreover, in the display device according to this embodiment, the bracket 17, the first fastener 41, and the second fastener 43 shown in FIGS. 7 to 8B may be applicable for coupling the PCB 15. Additionally, as shown in FIGS. 9 and 10, the third fastener 45 may be applicable.

Hereinafter, a configuration of a display device according to another embodiment of the present disclosure will be described with reference to FIGS. 13 to 15B. FIGS. 13 to 17 schematically illustrate only a configuration relating to the bending of the display module 11 merely to facilitate description of a structure and principle for bending a display device. However, the display device according to the present embodiment may include various other configurations besides the shown configuration.

Figure 13:
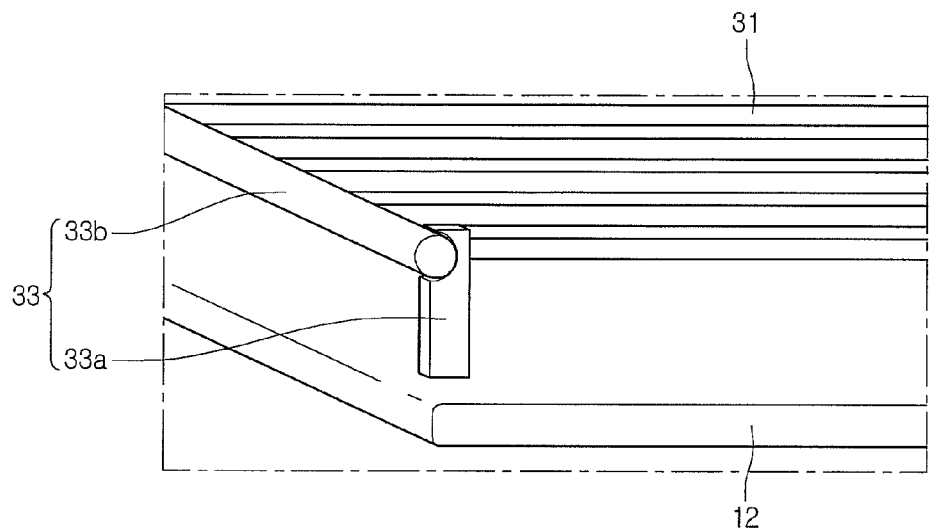
FIGS. 13 to 15B are views illustrating a partial configuration of a display device according to another embodiment of the present disclosure.
Figure 14:
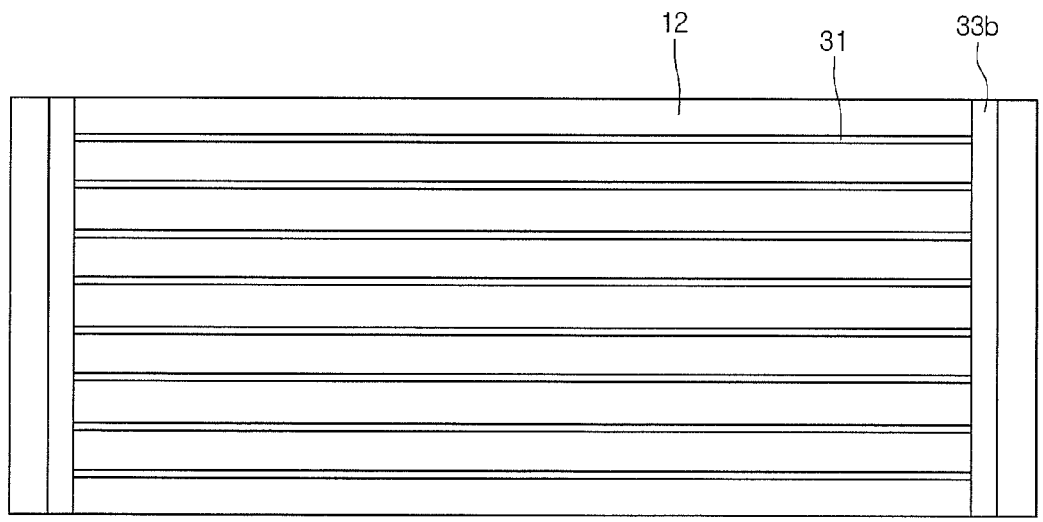
Figure 15A:
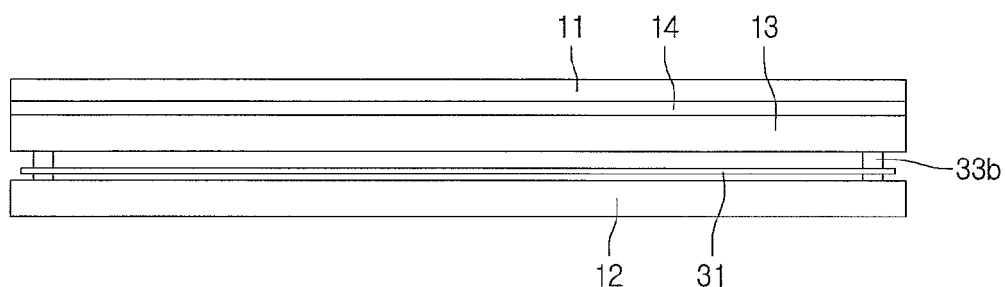
Figure 15B:
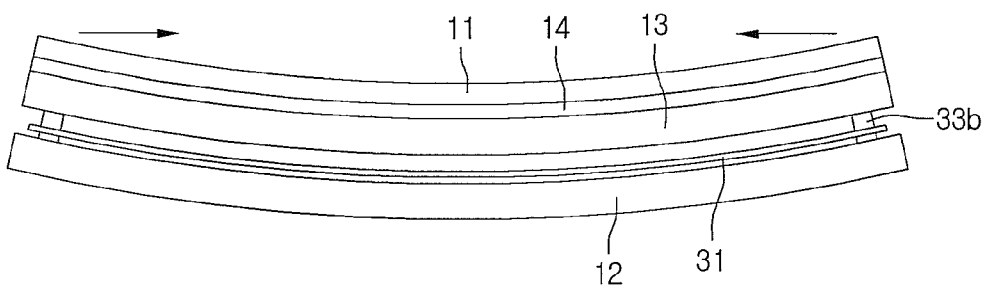

FIG. 13 is a perspective view illustrating the back cover 12 and the bending assembly of the display device, and FIG. 14 is a view illustrating the front side of the back cover 12. Moreover, FIGS. 15A and 15B are plan views of the display device. The display device may include a display unit and a bending assembly that bends the display unit: The display unit may include a display module 11, a thin plate-shaped middle cover 13 attached to the backside of the display module 11 (or display panel) through a double-sided tape 14 or another appropriate method of connection, and a back cover 12 coupled to the rear of the middle cover 13. The bending assembly may apply force to bend the back cover 12, so that the entire display unit may be bent.

Here, the bending assembly may include a bending actuator applying physical force to the back cover 12 and a bending control unit that controls operations of the bending actuator. The bending actuator may include an SMA 31 and a fixing unit 33 (or support bracket) fixing the SMA 31 to the front of the back cover 12. Also, the bending actuator may control a length change of the SMA 31.

The fixing unit 33 may include four extension units 38a that extend front to back and protruding toward the front around each edge of the back cover 12. The fixing unit 33 may have a roughly rectangular shape and a vertical extension unit 33b that vertically connects two extension units 38a may be provided around the left and right sides of the back cover 12. The vertical extension unit 33b may be provided to be in one or more pairs. As illustrated, the vertical portions may be provided a prescribed distance from the back cover toward the display panel.

The SMA 31 extends across two vertical extension units 33b. The SMA 31 may be provided to have a rod shape that extends in the left and right directions, and may be provided in plurality to extend horizontally, parallel to each other. The rod shape may have various cross-sections, such as a round shape, square shape or the like. For example, the SMA 31 may have a wire shape.

Accordingly, the SMA 31 may be coupled to a position that is spaced toward the front from the front side of the back cover 12, and extends parallel to the front side of the back cover 12. That is, the left end part of the SMA 31 may be coupled to the vertical extension unit 33b at the left side and the right end part of the SMA 31 may be coupled to the vertical extension unit 33b at the right side. Moreover, the fixing unit 33 and the SMA 31 may be formed as one module. When a module including the fixing unit 33 and the SMA 31 is manufactured separately and is coupled to the front side of the back cover 12, manufacturing efficiency may be improved.

In this embodiment, the SMA 31 may maintain a predetermined length at a room temperature and when the temperature rises more than a set temperature, its length is reduced. At this point, the rise in the temperature may be achieved by a power supply that is controlled by the bending control unit.

Accordingly, once current is supplied to the SMA 31, the resistance of the SMA 31 may produce a prescribed amount of heat causing its temperature to increase. As the temperature increases, the length of the SMA 31 is reduced in the lateral, e.g., left and right, directions.

When the length of the SMA 31 is reduced from FIG. 15A to FIG. 15B, the back cover 12 becomes bent and the both left and right end parts protrude toward the front relatively, and its center has a concavely retreated shape. At this point, an angle at which the back cover 12 bends may be adjusted by controlling the amount of current through the SMA 31.

When the back cover 12 is bent, pressure is forwardly applied on the both left and right ends of the middle cover 13 from the front of the back cover 12, and due to this, the display module 11 is also concavely bent toward the front. Therefore, user's immersion may be increased. Moreover, when power is cut off by the bending control unit, and thus a temperature of the SMA 31 drops, the length of the SMA 31 is increased again and the display module 11 and the back cover 12 return to their original flat states by the elastic restoring force of the material.

Moreover, the bracket 17, the first fastener 41, and the second fastener 43 shown in FIGS. 7 to 8B may be applicable to the display device according to this embodiment. Additionally, as shown in FIGS. 9 and 10, the third fastener 45 may be also applicable.

Hereinafter, a partial configuration of a display device will be described with reference to FIGS. 16 to 19. FIGS. 16 to 19 schematically illustrate only a partial configuration relating to the bending of the display module 11 merely to facilitate description for a structure and principle for bending a display device. However, the display device according to the present embodiment may include various other configurations besides the shown configuration.

Figure 16:
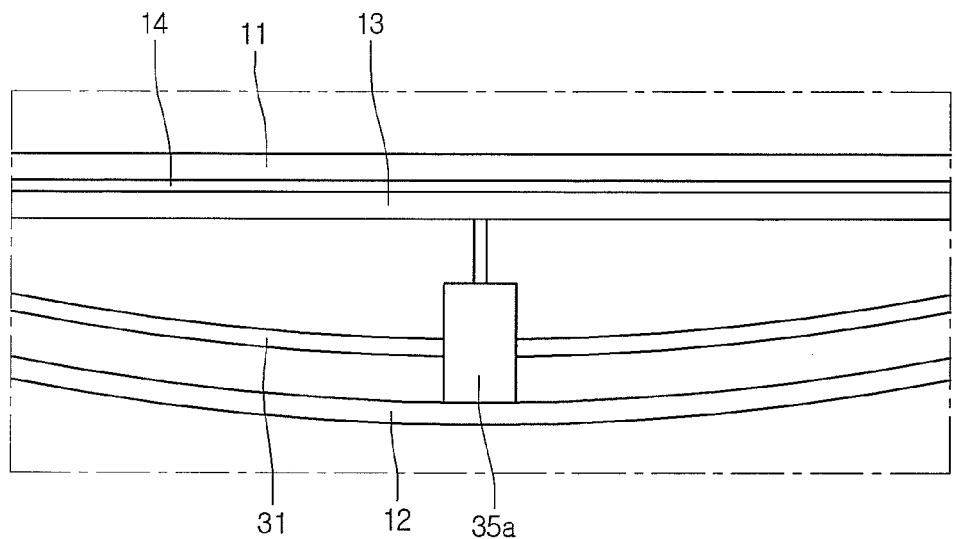
FIGS. 16 to 17 are views illustrating a partial configuration of a display device according to another embodiment of the present disclosure.
Figure 17:
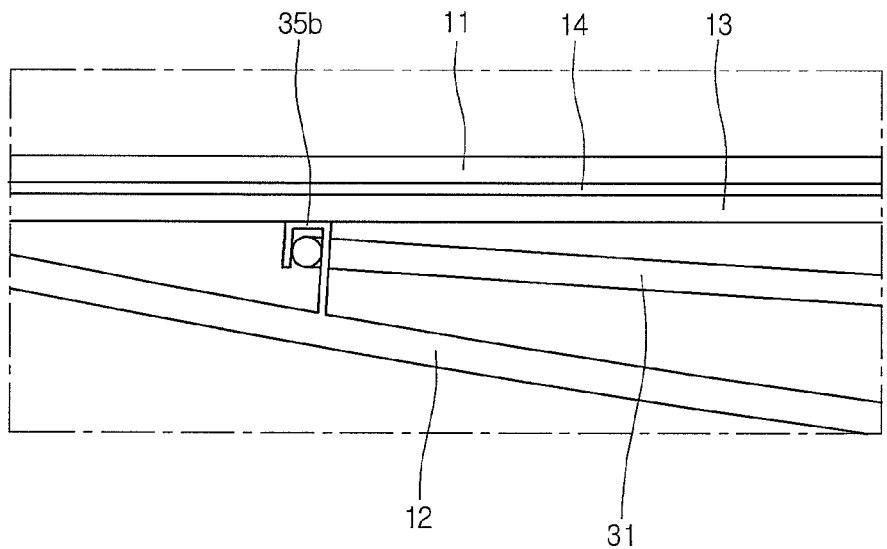

FIG. 16 illustrates the middle portion of the display module 11, the back cover 12, and the middle cover 13 in the display device. FIG. 17 illustrates a portion horizontally deviated from the center of the display module 11, the back cover 12, and the middle cover 13 in the display device. The display device may include a display unit and a bending assembly that bends the display unit. The display unit may include a display module 11, a middle cover 13 located at the rear of the display module 11, and a back cover 12 located at the rear of the middle cover 13. The bending assembly applies physical force to the back cover 12, so that the entire display unit may be bent. The middle cover 13 may be attached to the backside of the display module 11 by using a double-sided tape 14 or another appropriate method of connection. The back cover 12 may have a shape in which the left and right ends protrude toward the front relative to the center, and the center is curved toward the rear. Accordingly, the central part of the back cover 12 is spaced from the middle cover 13 toward the rear and the left and right end parts of the back cover 12 contact the left and right edge backside of the middle cover 13. At this point, the back cover 12 and the middle cover 13 may contact directly, or may contact through a sliding member 37 as described in more detail hereinafter. Additionally, when the sliding member 37 is provided, the left and right end parts of the back cover 12 and the middle cover 13 may not contact each other, and thus may be spaced apart from each other.

Moreover, the bending assembly may include a bending actuator that applies physical force to the back cover 12 and a bending control unit that controls operations of the bending actuator. The bending actuator may include an SMA 31 (or elastic member) and fixing units 35a and 35b (or support bracket) fixing the SMA 31 to the rear of the back cover 12. The bending control unit may control a length change of the SMA 31.

The fixing units 35a and 35b may include a central fixing unit 35a (or center support) protruding toward the front from the front side at the left and right direction center of the back cover 12 and a side fixing unit 35b (or lateral support) protruding from the front side toward the front around the left and right both end parts of the back cover 12.

The front end of the central fixing unit 35a is coupled to the rear of the left and right direction center of the middle cover 13, and the rear end is coupled to the left and right direction center of the back cover 12. At this point, the central fixing unit 35a may function as a spacer to maintain a predetermined interval between the back cover 12 and the middle cover 13.

The SMA 31 may be attached to the both left and right sides of the central fixing unit 35a, or the central fixing unit 35a may serve as a supporter to allow one SMA 31 to pass through. An end part of the SMA 31 may be fixed at the side fixing unit 35. The SMA 31 may be provided in a wire shape extending in the left and right directions, and is forwardly spaced a predetermined distance apart from the back cover 12.

The SMA 31 may maintain a predetermined length at a room temperature and when the temperature rises more than a set temperature, its length may be reduced. At this point, the rise in the temperature is achieved by power supply that is controlled by the bending control unit. Accordingly, once power is supplied by the bending control unit, the resistance of the SMA 31 causes generation of heat and its temperature rises. As the temperature rises, the length of the SMA 31 is reduced in the lateral, e.g., left and right, directions.

When the length of the SMA 31 is reduced, the both end parts (or lateral sides) of the back cover 12 are pulled toward the center, and as the distance between the both end parts of the back cover 12 becomes narrower, both end parts of the back cover 12 are moved toward the front relative to the center. Then, the both end parts of the back cover 12 forwardly apply pressure to a point horizontally deviated from the center of the mid cover 13, so that the display module 11 becomes bent.

At this point, the back cover 12 may have a curved shape whose center in the lateral direction is curved toward the rear relatively and both lateral ends protrude toward the front relatively. In this case, when the distance between the both end parts of the back cover 12 becomes narrower, the back cover 12 becomes bent with a greater curvature than the original, which then forwardly applies pressure to a point horizontally deviated from the center of the mid cover 13 so that the display module 11 becomes bent. At this point, an angle at which the back cover 12 bends may be adjusted by controlling current flow through the SMA 31.

Since the central fixing unit 35a maintains a predetermined interval laterally between the center of the back cover 12 and the center of the display module 11, when the back cover 12 is bent, forward pressure is applied by both the left and right ends of the back cover 12 to both the left and right end parts of the display module 11 to simultaneously bend the display module 11. Therefore, user's immersion may be increased.

Moreover, when power is cut off by the bending control unit and thus a temperature of the SMA 31 drops, the length of the SMA 31 is increased and the display module 11 and the back cover 12 return to their original flat states by the elastic restoring force of the material. Moreover, the sliding member 37 shown in FIGS. 18 and 19 may be additionally included in the above configuration.

The sliding member 37 may be fixed at one of the back cover 12 or the middle cover 13 and may be slidable at the other. That is, the sliding member 37 may be coupled to the front side of the back cover 12 so that it may slide relative to the backside of the middle cover 13, or may be coupled to the rear of the middle cover 13 so that it may slide relative to the front of the back cover 12. Additionally, the sliding member 37 may be coupled to each of the back cover 12 and the middle cover 13, so that sliding may occur between a portion coupled to the back cover 12 and a portion coupled to the middle cover 13.

Figure 18:
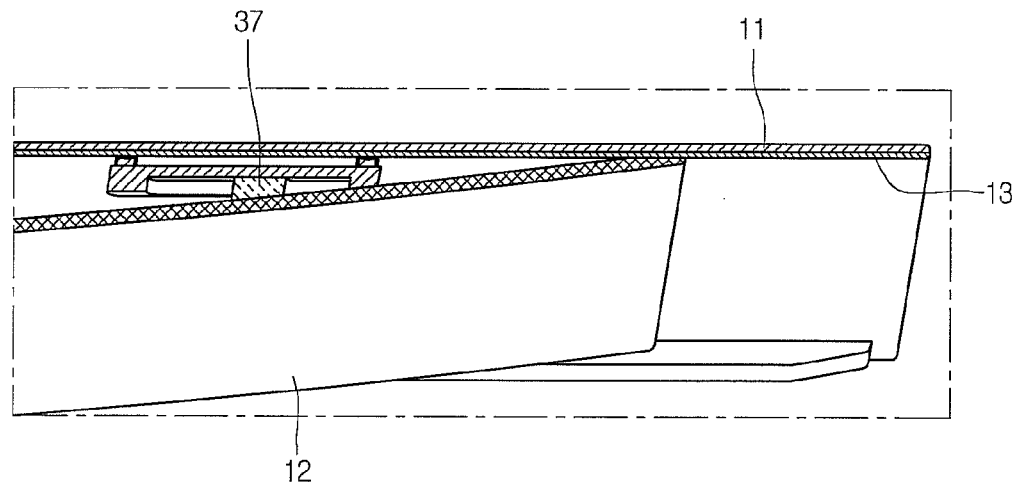
FIG. 18 is a view when a sliding member is applied and FIG. 19 is a view of an individual sliding member.
Figure 19:
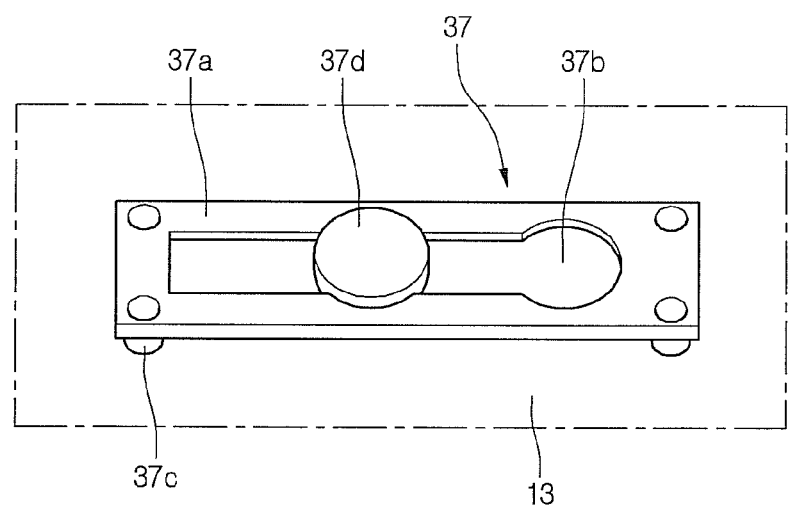

Hereinafter, a configuration and function of the sliding member 37 according to this embodiment will be described with reference to FIGS. 18 and 19. The sliding member 37 slide relative to a body 37a fixed at the middle cover 13 and a moving member 37d fixed at the back cover 12 to be movable horizontally.

The body 37a may have a plate-shaped member that extends horizontally, and its center slide relative to a sliding area 37b extending horizontally. Moreover, a fixing unit 37c protruding toward the front side may be provided at the front side of the body 37a. The fixing unit 37c may be fixed by directly contacting the backside of the middle cover 13, and the body 35a may be spaced by the length of the fixing unit 37c apart from the middle cover 13. The moving member 37d may be provided to allow reciprocating sliding in the sliding area 37b, and its flat backside may be coupled to the front side of the back cover 12. Since the sliding member 37 is provided, the back cover 12 and the middle cover 13 may have coherence at a portion horizontally deviated from the center in addition to the center.

Moreover, when the sliding member 37 is provided between the back cover 12 and the middle cover 13, the left and right end parts of the back cover 12 protrude toward the front relatively by the bending assembly. When pressure is applied on the backside of the middle cover 13, the back cover 12 does not directly contact the middle cover 13 and contacts the middle cover 13 through the sliding member 37, allowing the display module 11 to be bent more efficiently. Additionally, when the sliding member 37 is provided, the left and right end parts of the back cover 12 may contact the middle cover 13 so that the back cover 12 applies pressure on the middle cover 13.

Moreover, the bracket 17, the first fastener 41, and the second fastener 43 shown in FIGS. 7 to 8B may be applicable to the display device according to this embodiment. Additionally, the third fastener 45 shown in FIGS. 9 and 10 may be also applicable.

Figure 20A:
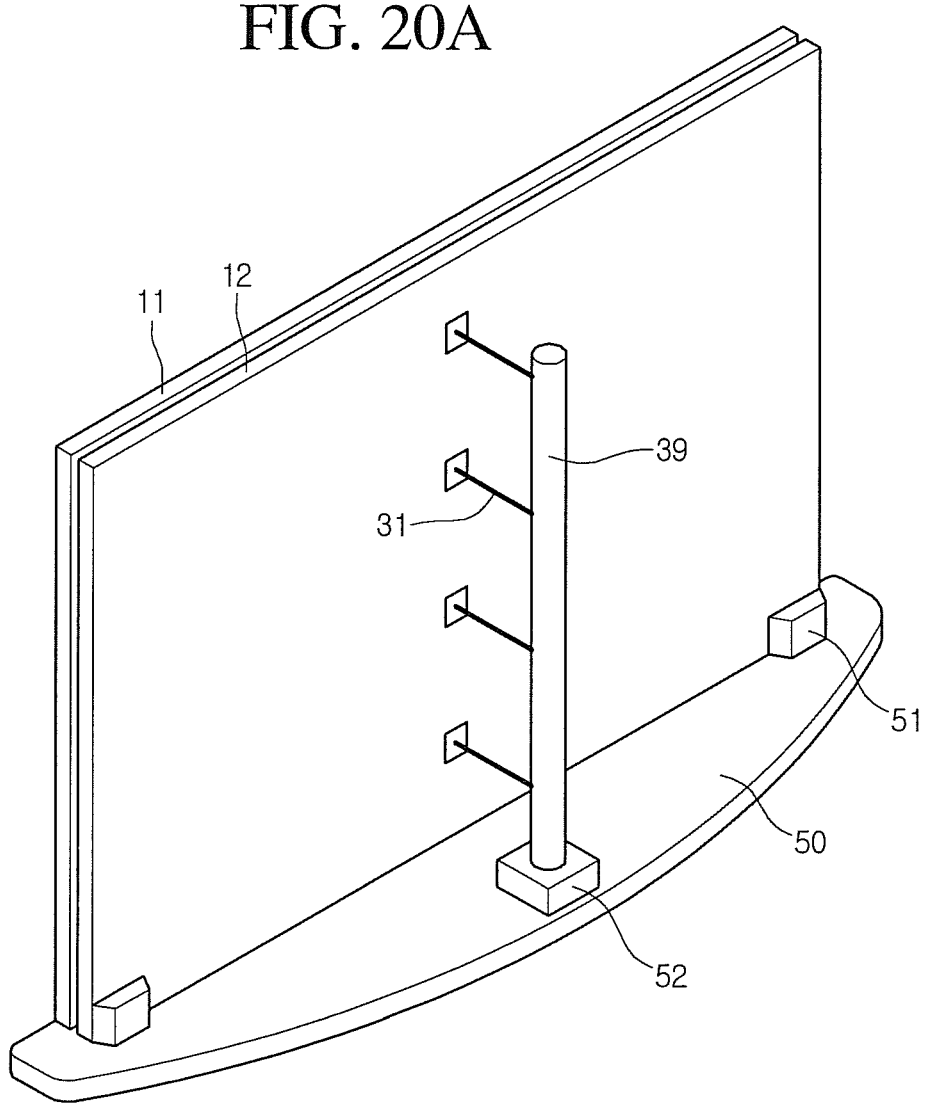
FIGS. 20A and 20B are views illustrating a partial configuration of a display device according to another embodiment of the present disclosure.
Figure 20B:
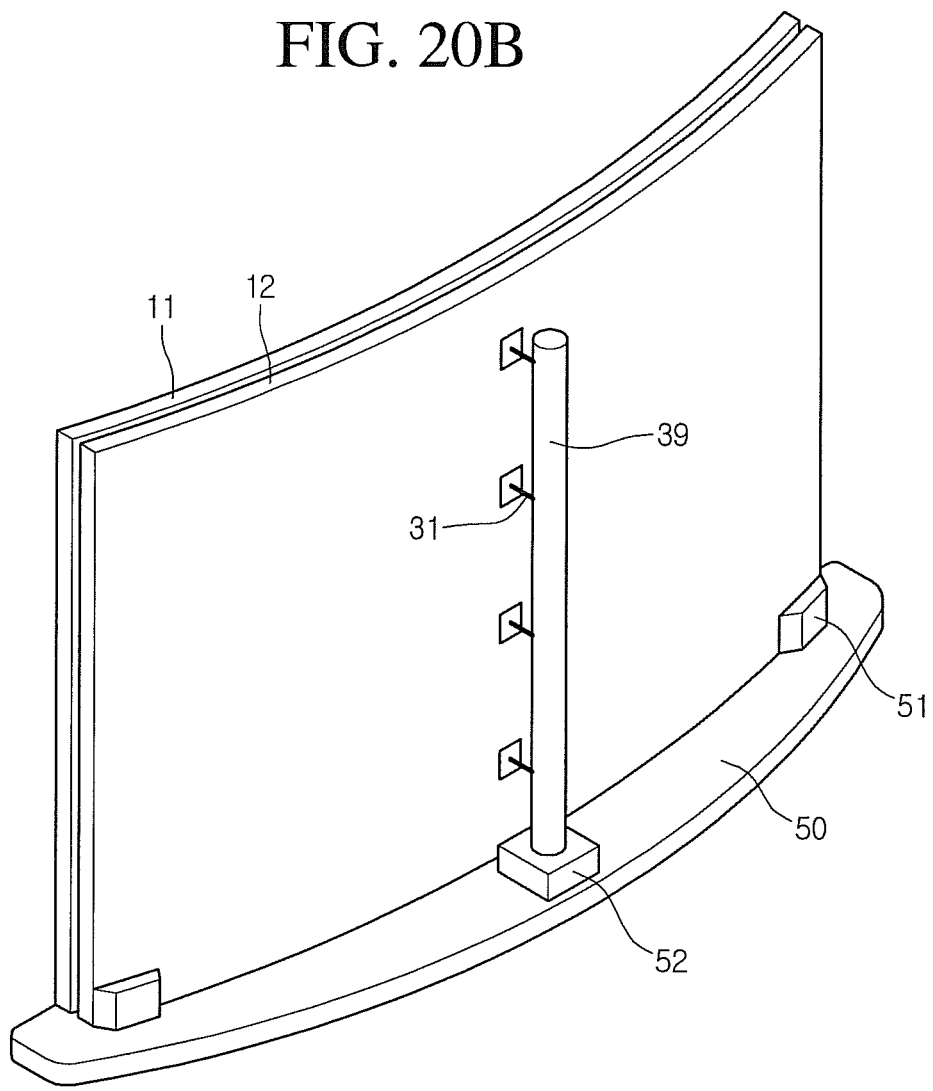

Hereinafter, a configuration of a display device will be described with reference to FIGS. 20A and 20B. FIG. 20A is a view of a flat state before a display unit of the display device is bent. FIG. 20B is a view when the display unit is bent. Merely for convenience and to facilitate description, a configuration shown in FIGS. 20A and 20B does not include all of the features of the display device, and only a partial configuration relating to the bending of the display module 11 is shown while other configurations are omitted.

The display device may include a display unit, a bending assembly bending the display unit, and a lower frame 50 supporting the display unit from the lower part. The display unit may include a display module 11 (or display panel) and a back cover 12 at the rear of the display module 11. The lower frame 50 receives various parts therein such as a control module, and the display module 11 and the back cover 12 are coupled to the top of the lower frame 50.

Additionally, a stopper 51 may be provided at the top of the lower frame 50 and may contact the backside of the back cover 12 at the rear of both the left and right ends of the back cover 12.

The bending assembly may include a bending actuator applying physical force to the back cover 12 and a bending control unit controlling operations of the bending actuator. The bending actuator includes an SMA 31, a fixing unit 39 fixing the SMA 31 to the rear of the back cover 12, and a motor 52 rotating the fixing unit 39. The bending control unit controls a length change of the SMA 31 and operations of the motor 52.

The fixing unit 39 (or support bracket) may be provide in a cylindrical shape extending in a vertical direction, and may be backwardly spaced apart from the center of the back cover 12. The SMA 31 (or elastic member) may be provided in a cylindrical or wire shape extending in a lateral direction. Its front end may be coupled to the center laterally at the backside of the back cover 2 and its rear end may be coupled to the fixing unit 39. A plurality of SMA 31 may be provided horizontally, parallel to each other.

The motor 52 may be coupled to the lower part of the fixing unit 39, and the fixing unit 39 may rotate by rotation of the motor 52. The bending control unit may be included in the control module provided at the inner side of the lower frame 50, and may control a current applied to the SMA 31 and rotation of the motor 52.

Accordingly, once current is supplied to the SMA 31 by the bending control unit, resistance of the SMA 31 may cause heat generation and its temperature rises. As the temperature rises, the length of the SMA 31 may be reduced in the lateral, e.g., left and right, directions.

When the length of the SMA 31 is reduced, the both left and right end regions of the back cover 12 are restrained from moving toward the rear, and only the center part is moved toward the rear, so that the back cover 12 has a bending shape that is centrally concaved relative to the front. At this point, an angle at which the back cover 12 is bent may be adjusted by controlling a current applied to the SMA 31.

Moreover, in this embodiment, auxiliary bending is possible by rotation of the motor 52. When the motor 52 rotates, the cylindrical fixing unit 37 rotates to wind the SMA 31 on its outer circumferential surface, so that the center part of the back cover 12 may be further pulled back. Accordingly, when the motor 52 is used sufficient bending effect may be achieved even when the reduced length of the SMA 31 is insufficient for the desired amount of bending.

Additionally, when the length reduction of the SMA 31 is not obtained properly, the bending of the back cover 12 and the display module 11 becomes possible. Also, as the fixing unit 37 rotates, it winds the outer circumference surface with the SMA 31, so that the center part of the back cover may be further retreated.

As mentioned above, when the back cover 12 is bent, the left and right direction center of the back cover 12 is retreated and thus, the left and right direction center part of the display module 11 is pulled toward the rear. Due to this, the display module 11 is bent simultaneously. Therefore, user's immersion may be increased by bending the display unit.

Moreover, when power is cut off by the bending control unit, and thus a temperature of the SMA 31 drops, the length of the SMA 31 is increased and the display module 11 and the back cover 12 return to their original flat states by the elastic restoring force of the material. In this case, if the wire-shaped SMA 31 is wounded on a fixing unit by rotating a motor, the display module 121 returns to a flat state by reversely rotating the fixing unit to unwind the SMA 31.

Figure 21A:
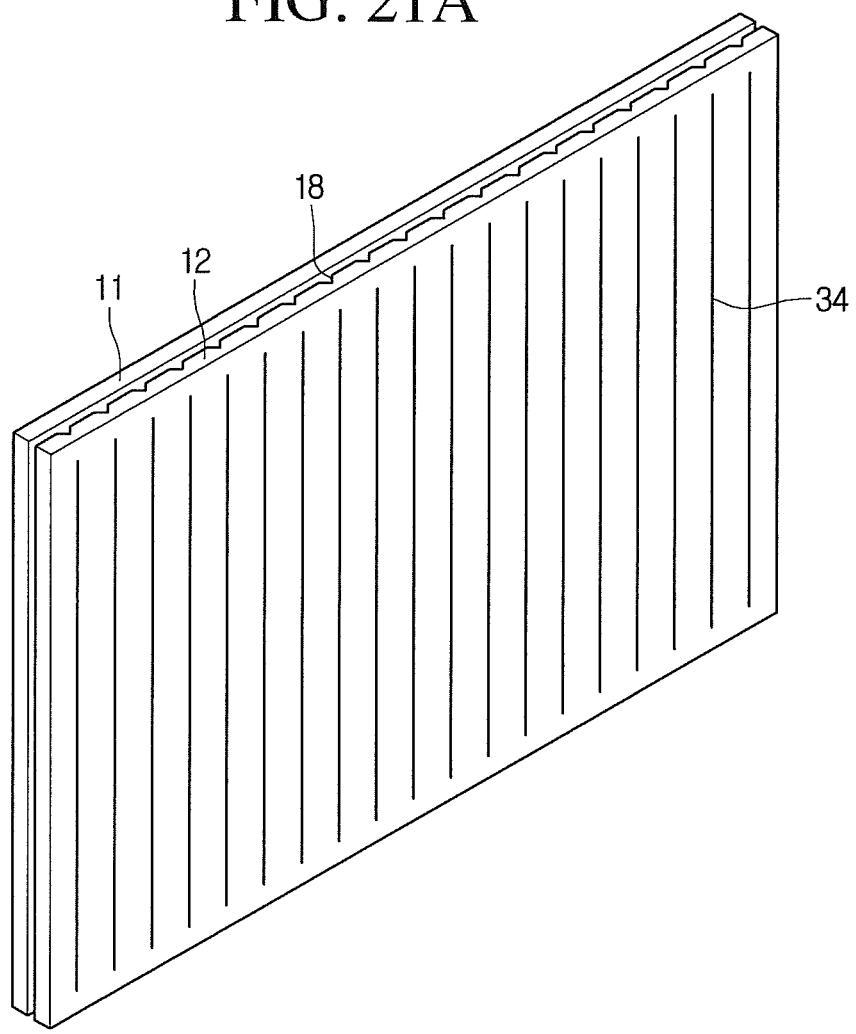
FIG. 21A is a view illustrating a display module, a back cover, and a bending actuator according to an embodiment of the present disclosure.
Figure 21B:
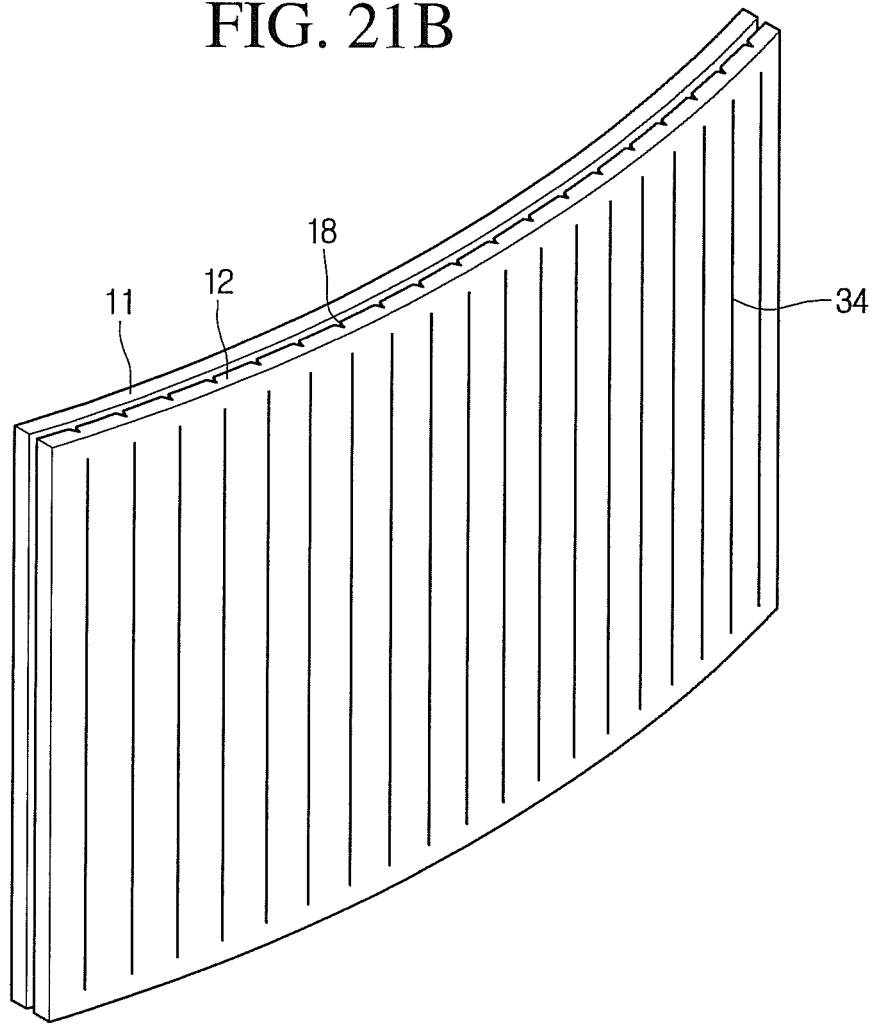
FIG. 21B is a view when
Figure 22:
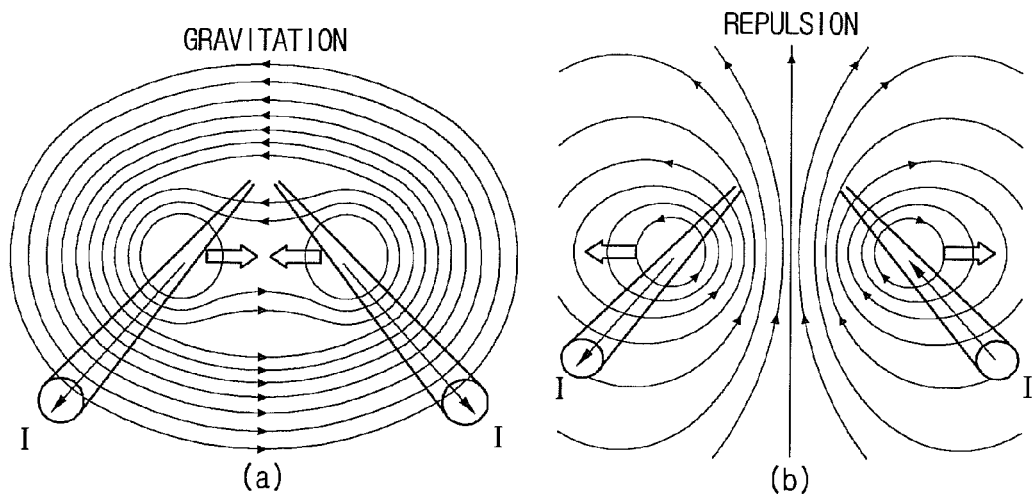
FIG. 22 is a view illustrating a direction of force applied between parallel straight currents.

Hereinafter, a display device will be described with reference to FIGS. 21A to 22. FIGS. 21A to 22 schematically illustrate only a configuration relating to the bending of the display module 11 merely to facilitate description of a structure and principle for bending a display device. However, the display device may include various other configurations besides the shown configuration.

The display device may include a display unit displaying an image and a bending assembly bending the display unit. The display unit may include a display module 11 displaying an image and a back cover 12 coupled to the rear of the display module 11.

The bending assembly may include a bending actuator applying physical force to the back cover 12 and a bending control unit controlling operations of the bending actuator. The bending actuator may be a leading wire 34 coupled to the rear of the back cover 12 to flow current.

FIG. 21A is a view of a flat state when the display module 11 and the back cover 12 are not bent. FIG. 21B is a view when the display unit 11 and the back cover 12 are bent. FIGS. 21A and 21B are views when a plurality or wires 34 coupled to the rear of the back cover 12 extend vertically. Additionally, FIG. 22 is a view illustrating the direction of a current flowing in a wire and the direction of a force acting on between wires.

As shown in FIG. 22(*a*), when the direction of a current flowing in one wire is the same as that in an adjacent wire, gravitation acts on between two wires. As shown in FIG. 22(*b*), when the direction of a current flowing in one wire is different from that in an adjacent wire, repulsion acts on between two wires.

Referring to FIGS. 21A and 21B, the wire 34 may be provided in plurality vertically in parallel to each other. Each wire 34 extends in parallel to another adjacent wire 34. The wire 34 may be attached to the backside of the back cover 12, or may be built in the back cover 12. The wire 34 may be built in the back cover 12, it needs to be positioned at the rear on the basis of the back and forth direction center of the back cover 12.

Moreover, as shown in FIGS. 21A and 21B, a groove part 18 formed long vertically may be provided at the front of the back cover 12. The groove part 18 may have a roughly V-shaped shape whose left and right widths become narrower gradually as they approach the rear from the front, and a plurality of groove parts 18 are horizontally arranged in parallel to each other. Each groove part 18 may be disposed parallel to an adjacent groove part 18.

Moreover, the left and right direction central parts of the back cover 12 and the display module 11 may be fixed, and other parts other than the fixed central parts may be installed not to restrain the movement in the front and rear directions. Therefore, when the back cover 12 and the display module 11 are bent, the left and right direction edges may move back and forth.

However, the back cover 12 and the display module 11 may be installed so that the back and forth movements of both end parts are restrained and a central part of the left and right directions may move back and forth. In this case, the back cover 12 and the display module 11 may be bent.

Due to the above configuration, when current is applied to the wire 34 by the bending control unit, it generates a magnetic field. At this point, a current flowing into the wire 34 is controlled so that the direction of a current flowing in one wire 34 is opposite to that in an adjacent wire 34. Therefore, repulsion occurs between the one wire 34 and the adjacent wire 34.

When repulsion acts on between each wire 34, a force in the lateral direction is applied to the rear of the back cover 12 relative to its center. Accordingly, the back cover 12 and the display module 11 change from a flat shape shown in FIG. 21A into a shape whose both left and right ends protrude toward the front and the center is pushed back, as illustrated in FIG. 21B. At this point, since a plurality of groove parts 18 are formed in the front side of the back cover 12, the groove part 18 becomes smaller to aid the bending of the back cover 12, so that the back cover 12 may be bent with a smaller amount of force.

Moreover, the amount of current flowing in the wire 34 may be controlled by the bending control unit and by adjusting the amount of current, the bending degree of the back cover 12 and the display module 11 may be adjusted. Furthermore, the wire 34 may be coupled to the front of the back cover 12. In this case, the wire 34 may be attached to the front side of the back cover 12, or may be built at the front inside the back cover 12 in the front to back direction relative to a thickness of the back cover 12.

When the wire 34 is coupled to the front of the back cover 12, the bending control unit may allow the direction of a current flowing in each wire 34 to be identical. Due to this, gravitation may act on between each wire 34. Once gravitation occurs between each wire 34, since a force to narrow the left and right widths is applied to the front on the basis of the back and forth direction center of the back cover 12, an interval between the groove parts 18 becomes narrower. Due to this, the back cover 12 and the display module 11 may be bent toward the front. In this case, the degree of bending of the back cover 12 and the display module 11 may be controlled when the bending control unit controls current flow through the wires 34.

Moreover, as mentioned above, as the wire 34 serves as a bending actuator, when a current flowing in the wire 34 is cut off the display module 11 and the back cover 12 return to their original flat states by elastic restoring force. If necessary, a current flowing in the wire 34 is applied in an opposite direction, so that this may aid to unbend the display module 11 and the back cover 12 to the original states.

Moreover, a bending actuator configuring a bending assembly may be an electromagnet as shown in FIGS. 23 to 26. When compared with the configuration of FIGS. 21A and 21B, all other configurations are the same except that the wire 34 is replaced with an electromagnet 38, and thus repeated description is omitted.

Figure 24A:
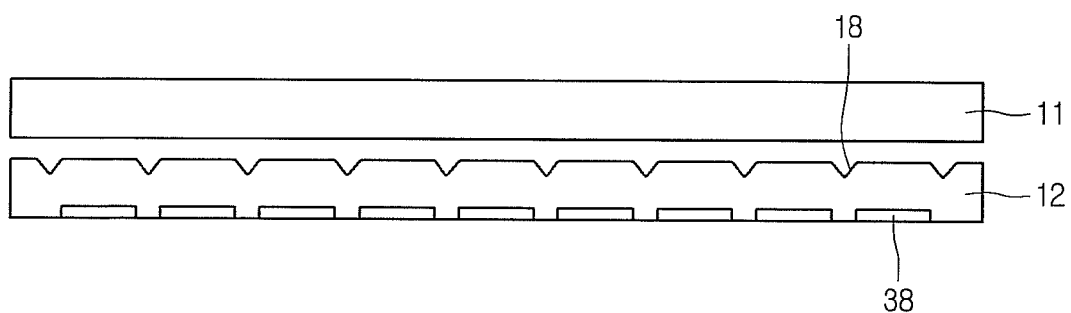
FIG. 24A is a view illustrating a flat cross section of FIG. 23.
Figure 24B:
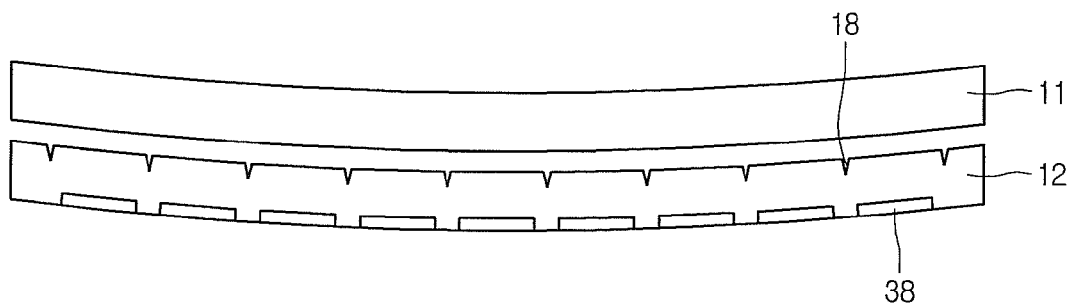
FIG. 24B is a view when
Figure 25:
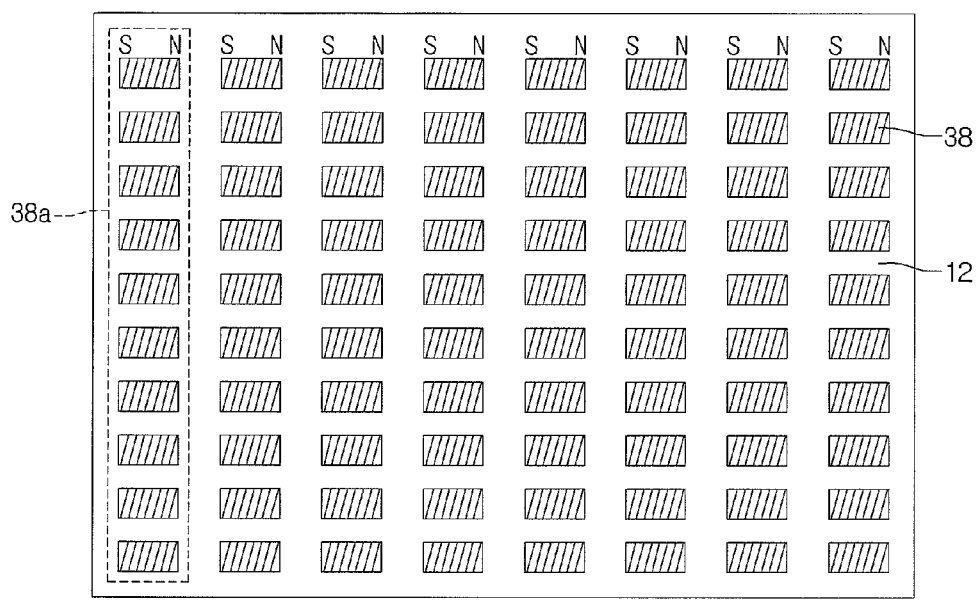
FIG. 25 is a view illustrating a display module, a back cover, and a bending actuator according to another embodiment of the present disclosure.
Figure 26:
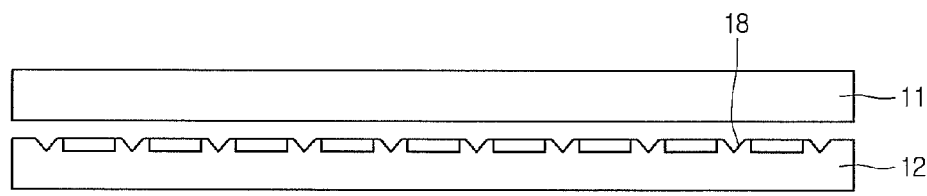
FIG. 26 is a view illustrating a flat cross section of FIG. 25.

FIGS. 23 to 25B are views when the electromagnet 38 is coupled to the rear of the back cover 12, and FIGS. 25 and 26 are views when the electromagnet 38 is coupled to the front of the back cover 12. The electromagnet 38 may extend to have its polarities in the lateral directions. That is, the left end part is an S pole, the right end part is an N pole. When the left end part is an N pole, the right end part is an S pole.

Figure 23:
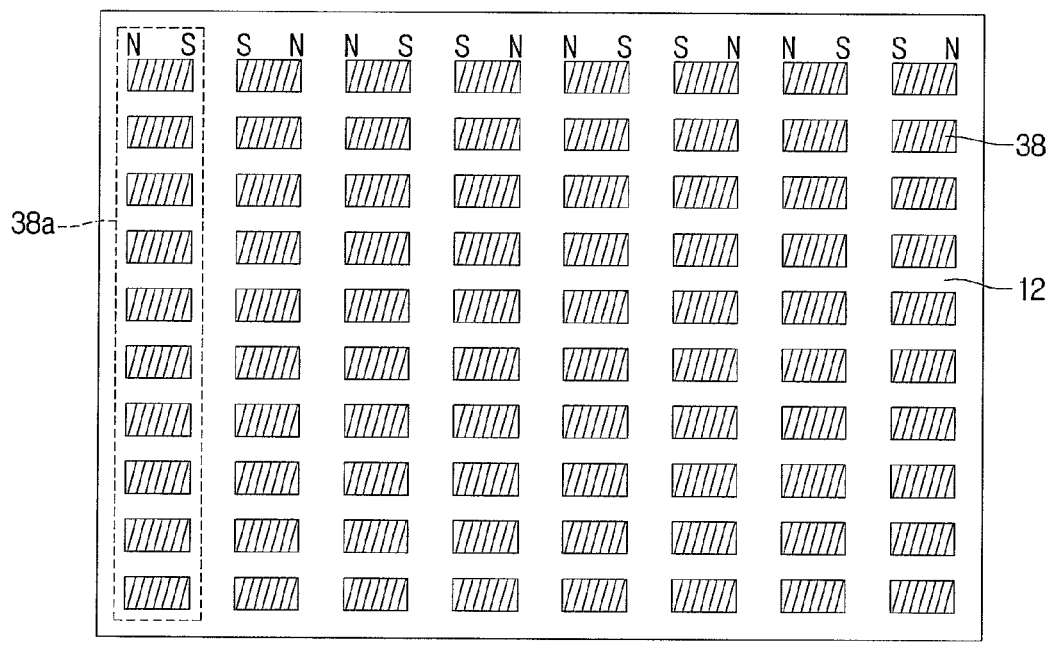
FIG. 23 is a view illustrating a display module, a back cover, and a bending actuator according to another embodiment of the present disclosure.

In relation to the electromagnet 38, a plurality of electromagnets which are vertically arranged in parallel to each other may form one electromagnet column 38a. A plurality of columns of electromagnets may be provided horizontally across the back cover 12 and aligned with adjacent electromagnets. The electromagnet 38 may generate different N and S poles depending on whether the electromagnet 38 is coupled to the front or rear of the back cover 12. Accordingly, as shown in FIG. 23, when a plurality of electromagnet columns are coupled to the rear of the back cover 12, the bending control unit controls the current to create repulsion between one electromagnet column and another adjacent electromagnet column.

Once repulsion acts between each electromagnet column, a force to expand the rear in the lateral direction is applied to the back cover 12 as illustrated in FIGS. 24A and 24B. Due to this, the back cover 12 and the display panel 11 are bent, so that the left and right direction end parts protrude toward the front and the central part is moved toward the rear. The bending of the back cover 12 bends the display module 11 a prescribed amount. At this point, an angle at which the display module 11 and the back cover 12 bend may be adjusted by controlling the amount of current flowing in the electromagnet.

Moreover, as shown in FIGS. 25 and 26, when a plurality of electromagnet columns are coupled to the front of the back cover 12, the bending control unit controls current to generate gravitation to act between one electromagnet column and another adjacent electromagnet column. FIG. 25 is a view when an electromagnet is coupled to the front of the back cover 12 and FIG. 26 is a plan view thereof.

Once gravitation is applied to between each electromagnet column, the front of the back cover 12 becomes narrower in the lateral direction. Due to this, the back cover 12 and the display module 11 may be bent. In this case, the amount of current flowing in the electromagnet 38 is controlled by the bending control unit, so that the degree of bending of the display module 11 and the back cover 12 may be adjusted.

Moreover, as mentioned above, as the electromagnet 38 serves as a bending actuator, when a current flowing in the electromagnet 38 is cut off, the display module 11 and the back cover 12 return to their original flat states by elastic restoring force. If necessary, a current flowing in the electromagnet 38 is applied in an opposite direction, so that this may aid to unbend the display module 11 and the back cover 12 to the original states. Additionally, when the electromagnet 38 is used as the bending actuator, the groove part 18 may be provided at the front of the back cover 12.

Moreover, a bending actuator configuring a bending assembly may be an bi-metal or piezoelectric element as shown in FIGS. 27 to 31. When compared with the configuration of FIGS. 23 to 25, all other configurations are the same except that the wire 34 is replaced with a bi-metal 36 or a piezoelectric element 36a, and thus repeated description is omitted.

Figure 27:
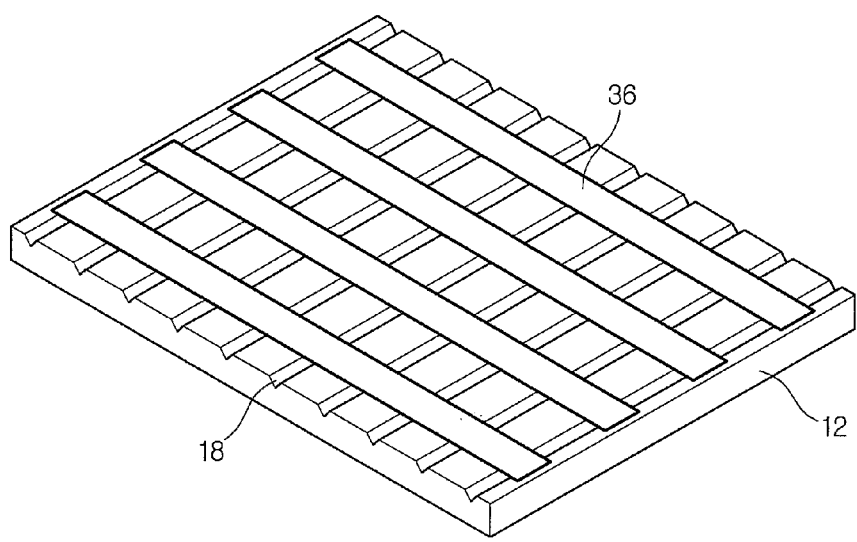
FIG. 27 is a view illustrating a display module, a back cover, and a bending actuator according to another embodiment of the present disclosure.
Figure 28:
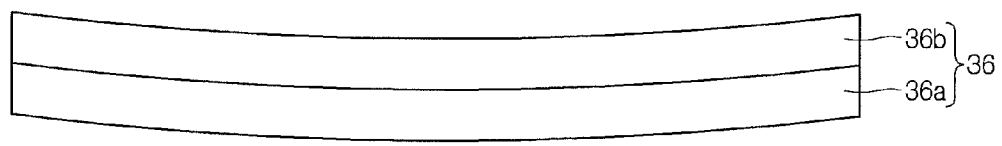
FIG. 28 is a sectional view of a bi-metal.
Figure 29:
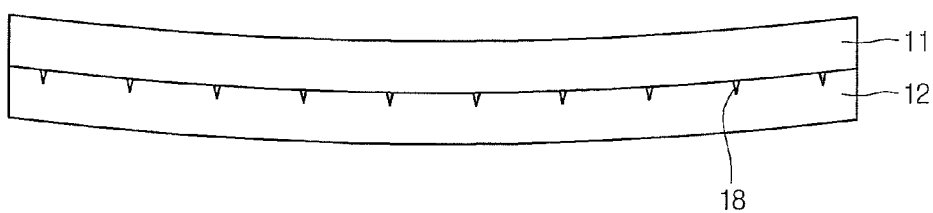
FIG. 29 is a plan view illustrating a back cover and a display module of FIG. 27.

FIGS. 27 to 29 are views when the bi-metal 36 is attached to the back cover 12. Accordingly, the bending actuator becomes the bi-metal 36. The bi-metal 36 refers to an object including thin metal plates that have different thermal expansion coefficients and are joined together. When temperature rises, a metal plate having a greater thermal expansion coefficient expands longer so that it is bent toward a metal plate having a less thermal expansion coefficient.

FIG. 27 is a view when the bi-metal 36 is attached to the front side of the back cover 12. FIG. 28 is a sectional view of the bi-metal 36. FIG. 29 is a view when the back cover 12 and the display module 11 are combined. First, referring to FIG. 28, the bi-metal 36 includes a first metal 36a having a relatively greater thermal expansion coefficient and a second metal 35a coupled to the front of the first metal 36a. At this point, the first metal 36a may be a piezoelectric element. A voltage applied to the piezoelectric element 36a may be controlled by the bending control unit.

The piezoelectric element 36a is a device having piezoelectric effect (when mechanical pressure is applied, voltage occurs and when voltage is applied, mechanical deformation occurs). When external force is applied, electric polarization occurs to generate potential difference and on the contrary, when voltage is applied, deformation or stress occurs.

The display device according to this embodiment uses the property that when voltage is applied to the piezoelectric element 36a, it expands. The piezoelectric element 36a may be formed of BaTiO3, PbZrO3 or another appropriate type of material. One bi-metal 36 may have a band shape and extends in the lateral direction. Also, a plurality of the bi-metal 36 may be provided vertically, in parallel to each other.

Moreover, a plurality of groove parts 18 may be provided perpendicular to a direction in which the piezoelectric element 36a extends. A configuration and functions of the groove part 18 are the same as described above.

Due to the above configuration, when power is supplied to the piezoelectric element 36a by the bending control unit, the length of the piezoelectric element 36a is increased and the both end parts of the bi-metal are bent toward the front. As the bi-metal 36 is bent, the back cover 12 is bent with the same curvature radius. Due to this, the display module 11 is bent simultaneously.

Accordingly, the back cover 12 and the display module 11 may have a shape in which the lateral ends protrude toward the front, and the center part is moved toward the rear. That is, the display unit is bent in a shape concaved toward the front.

At this point, when the bending control unit may control a voltage applied to the piezoelectric element 36a, the amount of length change in the piezoelectric element 36a is adjusted so that the bending amount of the back cover 12 may be controlled. Moreover, when the bending control unit cuts off a voltage applied to the piezoelectric device 36a, the piezoelectric device 36a returns to its original length, and also the back cover 12 and the display module 11 return to their original flat states.

Figure 30:
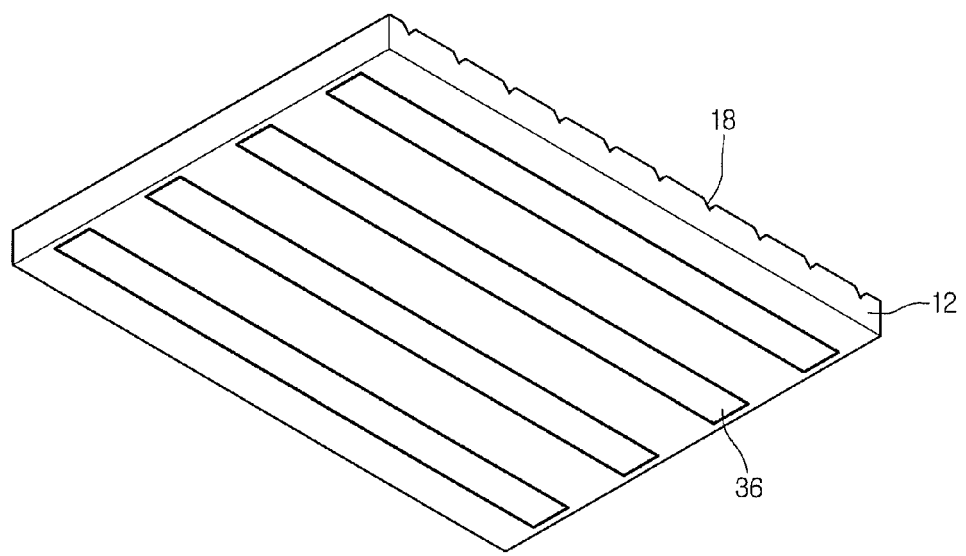
FIG. 30 is a view illustrating a bending actuator according to another embodiment of the present disclosure.

Additionally, as shown in FIG. 30, the bi-metal 36 may be coupled to the rear of the back cover 12. In this case, the configuration and operation principle of the bi-metal 30 are the same as those of FIGS. 9 to 11.

Figure 31:
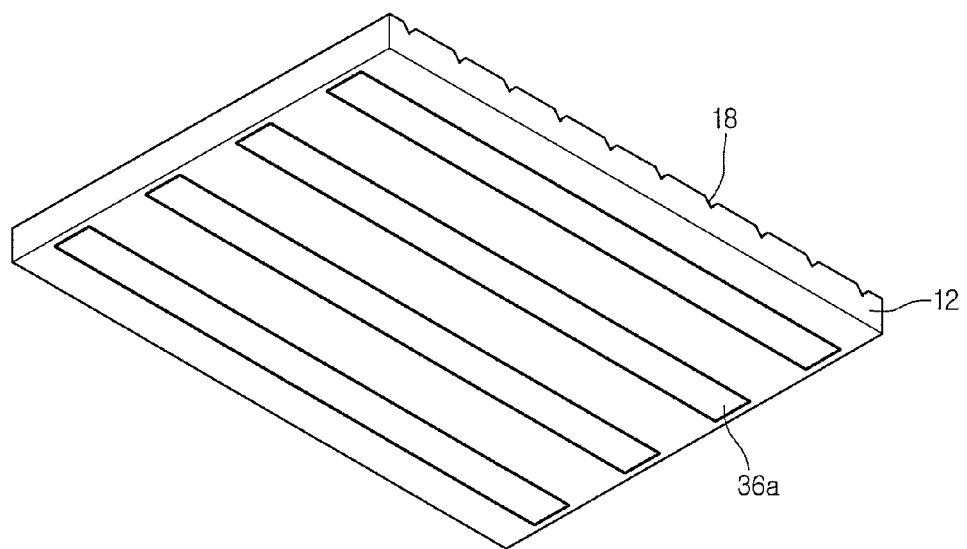
FIG. 31 is a view illustrating a bending actuator according to another embodiment of the present disclosure.

Moreover, the bending actuator may include only a piezoelectric element instead of the bi-metal 36. In FIG. 31, only the piezoelectric element 36a is attached to the position where the bi-metal 36 of FIG. 30 was attached before. Therefore, the piezoelectric element 36a extends in the left and right directions and is provided in plurality vertically in parallel to each other.

As mentioned above, since the length of the piezoelectric element 36a is increased by applying a predetermined voltage, after the piezoelectric element 36a is coupled to the rear of the back cover 12, when voltage is applied to the piezoelectric element 36a by the bending control unit, the length of the piezoelectric element 36a is increased so that the back cover 12 may be bent toward the front. When the piezoelectric element 36a is bent, the display module 11 is bent simultaneously, so that user's immersion may be improved.

Moreover, when the bending control unit cuts off a voltage applied to the piezoelectric element 36a, the piezoelectric element 36a returns to its original length, and also the back cover 12 and the display module 11 return to their original flat states by the restoring force of the piezoelectric element 36a and the elastic restoring force of the display panel 11 and the back cover 12.

Figure 32:
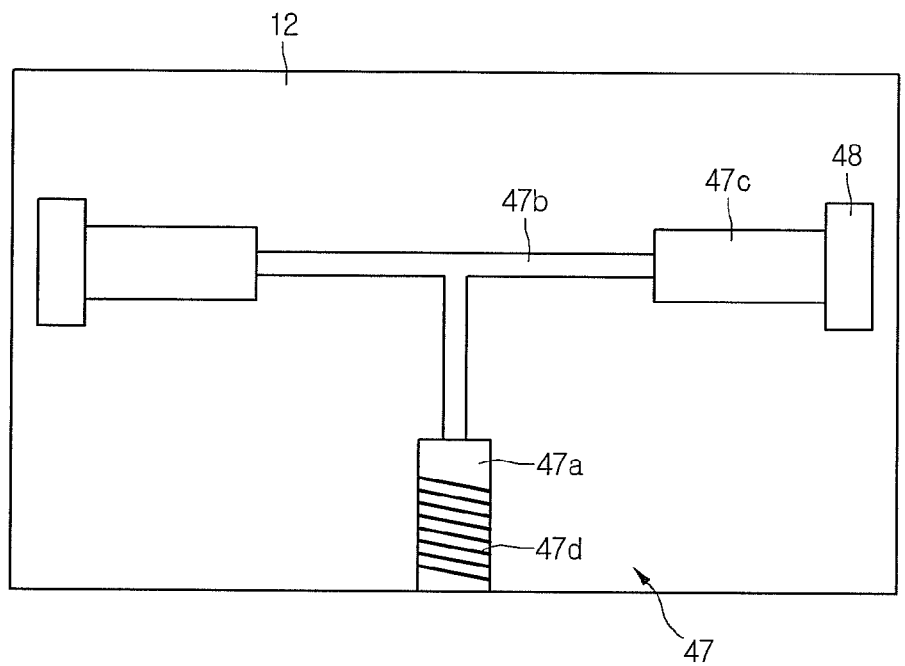
FIG. 32 is a view illustrating a bending actuator according to another embodiment of the present disclosure.
Figure 33:
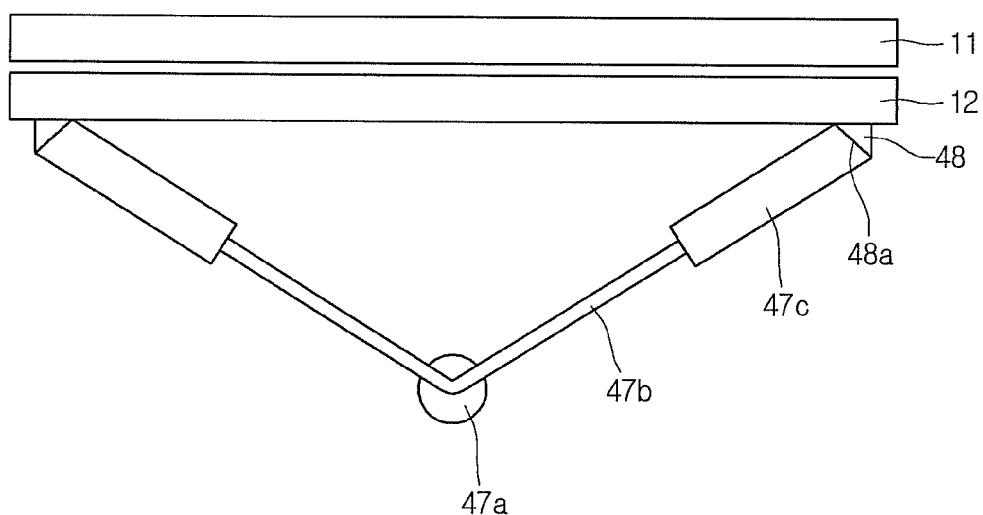
FIG. 33 is a view illustrating a plan view of FIG. 32.

FIGS. 32-33 illustrates another configuration of the bending actuator according to the present disclosure. The display device may include a display unit displaying an image and a bending assembly bending the display unit. The display unit may include a display module 11 displaying an image and a back cover 12 coupled to the rear of the display module 11. The bending assembly may include a bending actuator applying physical force to the back cover 12 and a bending control unit controlling operations of the bending actuator.

The bending actuator 47 shown in FIGS. 32 and 33 includes a sensitive heat tube 47a filled with refrigerant gas, a flow path 47b serving as a path through which the refrigerant gas of the sensitive heat tube 47a flows, a cylinder 47c coupled to the end part of the flow path 47b, and a heater 47d surrounding the external of the sensitive heat tube 47a. The heater 47d may be a heating wire.

The flow path 47b has a roughly T-shape as seen from the rear. The flow path 47b may extend from the sensitive heat tube 47a upward, is split into the left and right flow paths 47b at a predetermined position, and then extends at an angle toward the front left and right outer edges. Accordingly, the cylinder 47c coupled to a distal end of the flow path 47b also extends at an angle toward the front left and right outer edges.

Moreover, a stopping part 48 (or stopper) that protrudes toward the rear may be provided at both the left and right edges on the backside of the back cover 12. The stopping part 48 may include a pressing side 48a (or angled surface) toward a direction in which the cylinder 47c extends and the cylinder 47c contacts the pressing side 48a.

When voltage is applied to the heater 47d by the bending control unit and the heater 47d heats the refrigerant, the volume of the refrigerant gas expands and the cylinder 47c is pushed outward. The cylinder 47c applies pressure to the pressing side 48a of the stopping part 48 so that the lateral edges of the back cover 12 are pressed toward the front. Therefore, the back cover 12 is bent toward the front. When the back cover 12 is bent, the display module 11 at the front of the back cover 12 is concavely bent toward the front. Due to this, user's immersion may be increased.

Moreover, when the bending control unit cuts off the power applied to the heater 47d, the display module 11 and the back cover 12 return to their original flat states by the elastic restoring force thereof. Moreover, the bending actuator may have the structure shown in FIGS. 16 and 19.

FIGS. 34 to 47 illustrate another configuration of the bending actuator according to the present disclosure. The display device may include a display unit displaying an image and a bending assembly bending the display unit. The display unit may include a display module 11 displaying an image and a back cover 12 coupled to the rear of the display module 11.

The bending assembly may include a bending actuator applying physical force to the back cover 12 and a bending control unit controlling operations of the bending actuator. Here, the bending actuator may include a motor 49a, shafts 49b and 49c, and a speaker 49d.

Figure 34:
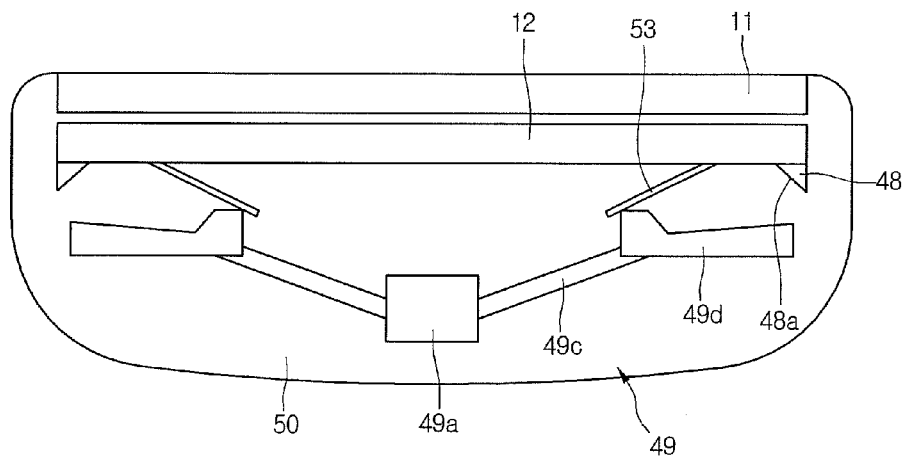
FIGS. 34 to 36 are views illustrating a bending actuator according to another embodiment of the present disclosure.
Figure 35:
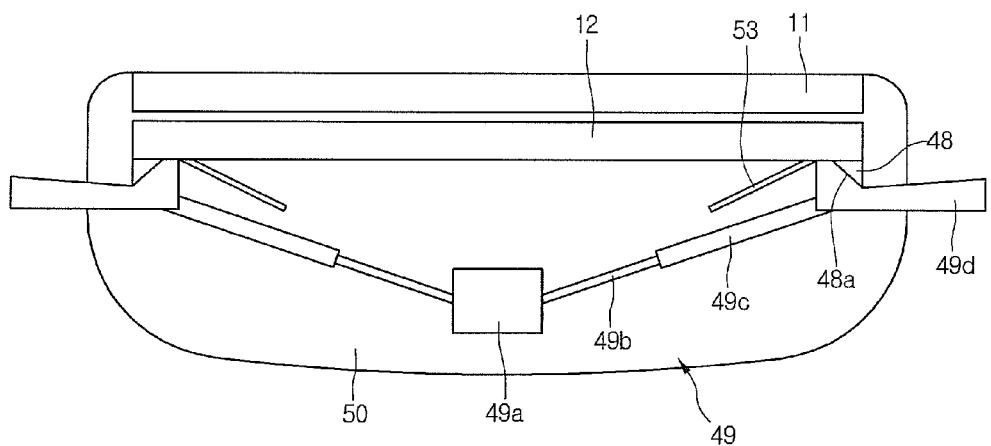
Figure 36:
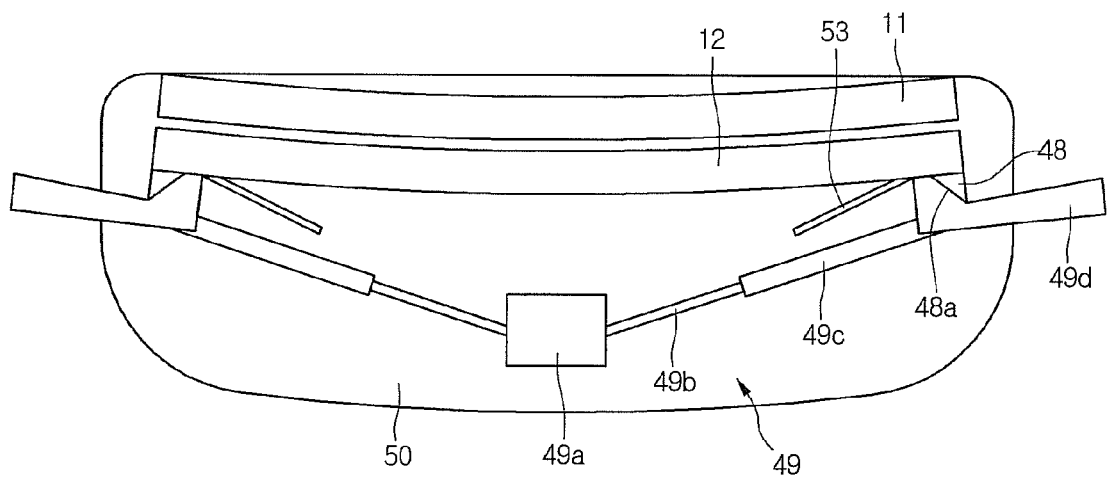
Figure 37:
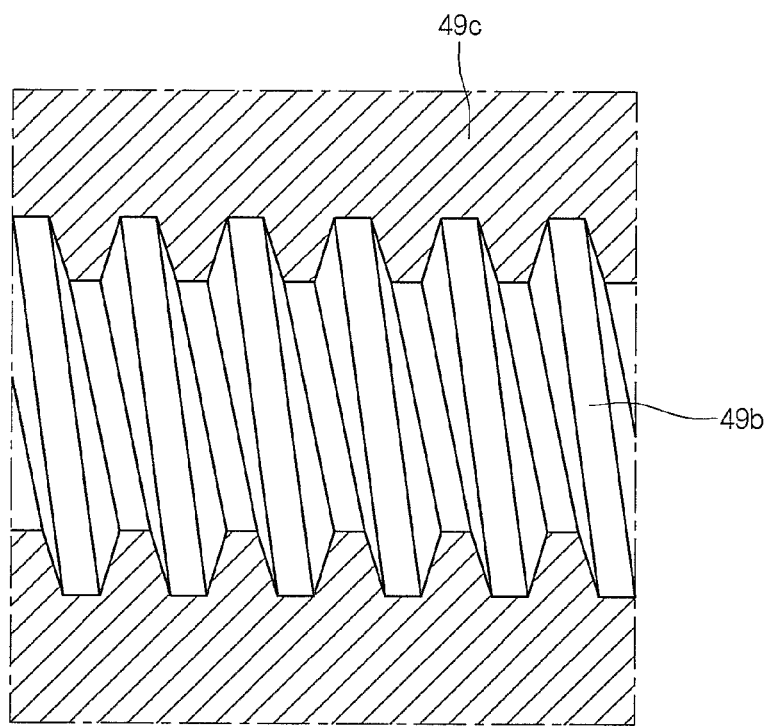
FIG. 37 is a sectional view illustrating a coupling structure of a first shaft and a second shaft.

FIG. 34 is a plan view when the speaker 49d is hidden by the rear of the display module 11 and the back cover 12. FIG. 35 is a plan view when the speaker 49d is visible at the left and right side of the display unit. FIG. 36 is a view when the speaker 49d is further pressed to bend the back cover 12 and the display module 11. Additionally, FIG. 47 is a sectional view illustrating a coupling structure of the first shaft 49b and the second shaft 49c.

In the bending assembly applied to the display device according to this embodiment, the bending actuator 49 may include the motor 49a and the shafts 49b and 49c. The shafts 49b and 49c may include a first shaft 49b having a screw gear on the outer circumference thereof and a hollow second shaft 49*c* having a gear corresponding to the first shaft 49*b* on the inner circumference thereof. Moreover, the speaker 49*d* is coupled to the end part of the second shaft 49*c* to be slidable.

The display module 11, the back cover 12, and the bending actuator 49 may all be provided on the lower frame 50. At this point, the center part of the display module 11 and the back cover 12 may be fixed at the lower frame 50, and both the left and right end parts are not fixed. Accordingly, when external force is applied from the rear to around the both left and right ends of the display module 11 and the back cover 12, the lateral ends may protrude toward the front when the display module is bent.

Moreover, the guide part 53 for guiding the sliding of the speaker 49*d* may be provided at the lower frame 50. The guide unit 53 protrudes toward the top of the lower frame 40 and extends in a straight line shape, and thus the speaker 49*d* contacts the backside of the guide unit 53 and is guided. Additionally, the stopping part 48 shown in FIGS. 34 to 36 is provided at the left and right edges of the back cover 12.

Under the above structure, when the bending control unit rotates the motor 49*a*, the rotation of the motor 49*a* rotates the first shaft 49*b*. At this point, a power transmitting means such as a gear, a chain, and a belt may be provided between the rotational axis of the motor 49*a* and the first shaft 49*b*.

The second shaft 49*c* may be pushed toward the outer edge as the first shaft 49*b* rotates inside second shaft 49*c*. At this point, in order for the second shaft 49*c* to be pushed toward the outer edges a prescribed amount, the rotation of the second shaft 49*b* needs to be limited. Since the second shaft 49*c* is coupled to the speaker 49*d* and the speaker 49*d* contacts the guide unit 53, the second shaft 49*c* is pushed toward the outer edge and to the front.

When the second shaft 49*c* is pushed, and thus the speaker 49*d* is pressed at an angle toward the edges, the speaker 49*d* which was hidden from view protrudes at the outer edges of the display module 11 as shown in FIG. 35. Accordingly, a user may control a display device to hide a speaker when not in use and show the speaker when in use.

Moreover, the speaker 49*d* is slid toward the outer edges and contacts the stopping part 48 as shown in FIG. 35. During this state, when the motor 49*a* rotates, the speaker 49*d* presses against the stopping part 48. Due to this, the lateral edges of the back cover 12 may be pressed toward the front. Therefore, as shown in FIG. 36, the lateral edges of the back cover 12 and the display module 11 may protrude toward the front to bend the display module 11 forward. Hence, the user's immersion may be improved. Furthermore, by reversing the rotation direction of the motor 49*a*, the bending control unit may return the bent display module 11 and back cover 12 to their original flat states.

Moreover, the bracket 17, the first fastener 41, and the second fastener 43 shown in FIGS. 7 to 8B may be applicable to the display device according to this embodiment. Additionally, the third fastener 45 shown in FIGS. 9 and 10 may be also applicable.

As broadly described and embodied herein, a display device is provided having a structure capable of improving user's immersion while viewing content. In one embodiment, a display device may include a display unit displaying an image, and a bending assembly bending the display unit. The bending assembly may include a bending actuator applying force to the display unit and a bending control unit controlling an operation of the bending actuator. According to the present disclosure, since a display module of a display device is bent, user's immersion may be improved. Also, the bending degree of a display module may be easily adjusted.

In one embodiment, a display device may include a display panel for displaying an image, a back cover provided behind the display panel and coupled to the display panel, a bending assembly coupled to the back cover to bend the display panel, and a controller configured to control the bending assembly to apply a physical force to the back cover to bend the display panel a prescribed amount.

The bending assembly may include a plurality of elastic members formed of shape memory alloy that expands or contracts corresponding to a change in temperature of the shape memory alloy. The shape memory alloy may have a cylindrical shape having a prescribed length that changes based on an amount of current that flows through the shape memory alloy.

The elastic members may be provided on the back cover to extend laterally across on the back cover such that the shape memory alloy expands or contracts laterally with respect to the back cover. The elastic members may be provided on a front surface or a rear surface of the back cover. A recess may be formed in the back cover to accommodate the elastic members.

A support bracket may be coupled to the back cover to support the shape memory alloy. A middle cover may be attached to a rear surface of the display panel and provided between the display panel and the back cover, wherein the support bracket is provided on a front surface of the back cover between the back cover and the middle cover, the shape memory alloy extending laterally along the back cover and coupled to the support bracket. The support bracket may include a plurality of vertical portions spaced a prescribed distance from the back cover toward the display panel, the elastic members coupled to the vertical portions to extend laterally across the back cover. Moreover, the support bracket and the elastic members may be modularized for coupling to the back cover.

A support bracket may be coupled to the back cover and may include a center support that extends vertically along a center of the back cover and a plurality of lateral supports provided at lateral regions of the back cover, the support bracket coupling the center and lateral regions of the back cover to the display panel, and the back cover may have a prescribed curvature in a lateral direction and when the shape memory alloy provided laterally along the back cover contracts in length, a center of the display is pulled toward the back cover to bend the display panel. When the shape memory alloy contracts, the prescribed curvature of the back cover may be increased to bend the display panel. The plurality of lateral supports may be slidable connectors that allow the middle cover to slide laterally relative to the back cover when the display panel is bent. The slidable connectors include a body fixed at one of the back cover or the middle cover and a moving member slidably coupled to the body and fixed to the other one of the back cover or the middle cover.

A support bracket may be provided a prescribed distance behind the back cover, the support bracket extending vertically and positioned to correspond to a center of the back cover, wherein the elastic members extend from the support bracket to the rear cover to pull the center of the rear cover toward the support bracket when the temperature of the shape memory alloy is increased above a prescribed level. A motor may be coupled to the support bracket to rotate the support bracket along a longitudinal axis of the support bracket, wherein the shape memory alloy is wound around an outer surface of the support bracket when the support bracket is rotated to bend the display panel.

The plurality of elastic members may be provided to extend parallel to each other to form a first column corresponding to a left side of the display panel and a second column corresponding to a right side of the display panel. The controller may control a length of the shape memory alloy in the left column to be different than in the right column. The controller may control an amount of current applied to the shape memory alloy to change a length of the shape memory alloy to bend the display panel.

The display device may also include a bracket coupled to a rear of the back cover, a printed circuit board coupled to a rear of the bracket, and a first fastener provided between the bracket and the back cover to couple the back cover to the bracket along a central vertical axis of the display panel. A second fastener may be provided between the bracket and the printed circuit board to couple the printed circuit board to the bracket along a lateral side of the printed circuit board. Another fastener may be provided between the bracket and the back cover to couple a lateral region of the back cover to the bracket, wherein this fastener includes a first portion coupled to the back cover and a second portion coupled to the bracket, the first portion being movably coupled to the second portion to allow lateral movement of the rear cover relative to the bracket.

The bending assembly may include a plurality of wires that extend vertically on the back cover and positioned a prescribed distance from each other in a lateral direction with respect to the display panel, the plurality of wires configured to apply a prescribed amount of force with respect to an adjacent wire to bend the display panel. The plurality of wires may be provided adjacent a front surface of the back cover that faces the display panel or adjacent a rear surface of the back cover opposite the front surface. Here, when the wires are provided adjacent the front surface of the back cover, the controller controls a direction of current through each wire to be the same to apply a force that pulls each wire toward an adjacent wire. Moreover, when the wires are provided at the rear surface of the back cover, the controller controls the current through each adjacent wire to be opposite to apply a force that pushes each wire away from an adjacent wire.

The bending assembly may include a plurality of electromagnets arranged relative to each other to apply a lateral force to the back cover. The plurality of electromagnets may be provided adjacent a rear surface of the back cover that faces away from the display panel, and the controller controls a direction of current through each electromagnet such that an N pole of one electromagnet faces an N pole of an adjacent electromagnet. Moreover, the plurality electromagnets may be provided adjacent a front surface of the back cover that faces the display panel, and the controller controls a direction of current through each electromagnet such that an N pole of one electromagnet faces an S pole of an adjacent electromagnet.

The bending assembly may include a bi-metal having a first metal provided at a front side that faces the display panel and a second metal provided at a rear side opposite the front side, the first metal having a thermal expansion coefficient that is relatively less than a thermal expansion coefficient of the second metal. The bending assembly may include a bi-metal having a first metal provided at a front side that faces the display panel and a second metal provided at a rear side opposite the front side, the second metal being a piezoelectric element. The bending assembly may also include a piezoelectric element that is coupled to the back cover, a length of the piezoelectric element configured to change in a lateral direction relative to the display panel.

The bending assembly may include a heat sensitive tube, refrigerant provided in the heat sensitive tube, a heater to heat the heat sensitive tube, and a cylinder connected to a distal end of the sensitive heat tube, wherein, when the heater heats the refrigerant, the heat sensitive tube expands to move the cylinder laterally to apply a lateral force to a side edge of the back cover. A stopper may be provided at a rear surface of the back cover that limits a range of movement of the cylinder, the stopper including an angled surface that abuts against the cylinder when the cylinder is moved laterally. The heater may be a heating wire that surrounds an outer surface of the heat sensitive tube.

The bending assembly may include a motor and a shaft provided behind the back cover and extending to a lateral region of the back cover, a length of the shaft being changed by driving the motor, wherein when the shaft is extended, a pressure is applied to a side edge of the back cover to bend the display panel. The shaft may include a first shaft that is rotated by the motor, and a second shaft coupled to the first shaft through a screw gear. Moreover, a speaker may be coupled to a distal end of the shaft. The speaker may be positioned behind the display panel when the length of the shaft is at a first length. The speaker may be positioned adjacent the display panel when the length of the shaft is at a second length greater than the first length. Moreover, the speaker may be positioned adjacent the display panel and a rear lateral edge of the back cover to apply the pressure to the side edge of the back cover to bend the display panel when the length of the shaft is at a third length greater than the second length. In the various embodiments, the back cover may be formed of a Carbon Fiber-Reinforced Plastic.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a display panel for displaying an image;
a back cover provided behind the display panel and coupled to the display panel;
a bending assembly coupled to the back cover to bend the back cover; and
a controller configured to control the bending assembly to apply a physical force to the back cover to bend the display panel a prescribed amount,
wherein the bending assembly includes a plurality of elastic members formed of shape memory alloy that expands or contracts corresponding to a change in temperature of the shape memory alloy,
wherein the elastic members are provided on a front surface or a rear surface of the back cover, and
wherein the display device further comprises:
a bracket coupled to a rear of the back cover via a first fastener; and
a printed circuit board coupled to a rear of the bracket, wherein the first fastener is provided between the bracket and the back cover to couple the back cover to the bracket along a central vertical axis of the display panel.

2. The display device according to claim 1, wherein the shape memory alloy has a cylindrical shape having a prescribed length that changes based on an amount of current that flows through the shape memory alloy.

3. The display device according to claim 1, wherein the elastic members are provided on the back cover to extend laterally across on the back cover such that the shape memory alloy expands or contracts laterally with respect to the back cover.

4. The display device according to claim 3, wherein a recess is formed in the back cover to accommodate the elastic members.

5. The display device according to claim 1, wherein a support bracket is coupled to the back cover to support the shape memory alloy.

6. The display device according to claim 5, further comprising a middle cover attached to a rear surface of the display panel and provided between the display panel and the back cover, wherein the support bracket is provided on a front surface of the back cover between the back cover and the middle cover, the shape memory alloy extending laterally along the back cover and coupled to the support bracket.

7. The display device according to claim 6, wherein the support bracket includes a plurality of vertical portions spaced a prescribed distance from the back cover toward the display panel, the elastic members coupled to the vertical portions to extend laterally across the back cover.

8. The display device according to claim 7, wherein the support bracket and the elastic members are modularized for coupling to the back cover.

9. The display device according to claim 1, wherein
a support bracket is coupled to the back cover and includes a center support that extends vertically along a center of the back cover and a plurality of lateral supports provided at lateral regions of the back cover, the support bracket coupling the center and lateral regions of the back cover to the display panel, and
the back cover has a prescribed curvature in a lateral direction and when the shape memory alloy provided laterally along the back cover contracts in length, a center of the display is pulled toward the back cover to bend the display panel.

10. The display device according to claim 9, wherein, when the shape memory alloy contracts, the prescribed curvature of the back cover is increased to bend the display panel.

11. The display device according to claim 10, wherein the plurality of lateral supports are slidable connectors that allow the middle cover to slide laterally relative to the back cover when the display panel is bent.

12. The display device according to claim 11, wherein the slidable connectors include a body fixed at one of the back cover or the middle cover and a moving member slidably coupled to the body and fixed to the other one of the back cover or the middle cover.

13. The display device according to claim 1, further comprising a support bracket provided a prescribed distance behind the back cover, the support bracket extending vertically and positioned to correspond to a center of the back cover, wherein the elastic members extend from the support bracket to the rear cover to pull the center of the rear cover toward the support bracket when the temperature of the shape memory alloy is increased above a prescribed level.

14. The display device according to claim 13, further comprising a motor coupled to the support bracket to rotate the support bracket along a longitudinal axis of the support bracket, wherein the shape memory alloy is wound around an outer surface of the support bracket when the support bracket is rotated to bend the display panel.

15. The display device according to claim 1, wherein the plurality of elastic members are provided to extend parallel to each other to form a first column corresponding to a left side of the display panel and a second column corresponding to a right side of the display panel.

16. The display device according to claim 15, wherein the controller controls a length of the shape memory alloy in the left column to be different than in the right column.

17. The display device according to claim 1, wherein the controller controls an amount of current applied to the shape memory alloy to change a length of the shape memory alloy to bend the display panel.

18. The display device according to claim 1, further comprising a second fastener provided between the bracket and the printed circuit board to couple the printed circuit board to the bracket along a lateral side of the printed circuit board.

19. The display device according to claim 18, further comprising a third fastener provided between the bracket and the back cover to couple a lateral region of the back cover to the bracket, wherein the second fastener includes a first portion coupled to the back cover and a second portion coupled to the bracket, the first portion being movably coupled to the second portion to allow lateral movement of the rear cover relative to the bracket.

20. The display device according to claim 1, wherein the bending assembly includes a bi-metal having a first metal provided at a front side that faces the display panel and a second metal provided at a rear side opposite the front side, the first metal having a thermal expansion coefficient that is relatively less than a thermal expansion coefficient of the second metal.

21. The display device according to claim 1, wherein the back cover comprises Carbon Fiber-Reinforced Plastic.

* * * * *